US012562727B2

(12) United States Patent (10) Patent No.: US 12,562,727 B2
Luo et al. (45) Date of Patent: Feb. 24, 2026

(54) VARIABLE SLEW-RATE CURRENT SOURCE GATE DRIVERS FOR HYBRID POWER MODULES

(71) Applicant: GM GLOBAL TECHNOLOGY OPERATIONS LLC, Detroit, MI (US)

(72) Inventors: Yilun Luo, Ann Arbor, MI (US); Benjamin S. Ngu, Royal Oak, MI (US); Mohammad N. Anwar, Van Buren Township, MI (US); Chandra S. Namuduri, Troy, MI (US); Michael Z. Pieszala, Panama City, FL (US); Brian A. Welchko, Oakland Township, MI (US); Rashmi Prasad, Troy, MI (US); Khorshed Mohammed Alam, Canton, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 0 days.

(21) Appl. No.: 18/610,912

(22) Filed: Mar. 20, 2024

(65) Prior Publication Data

US 2025/0300650 A1 Sep. 25, 2025

(51) Int. Cl.
H03K 17/00 (2006.01)
B60L 53/14 (2019.01)
(Continued)

(52) U.S. Cl.
CPC ............ H03K 17/063 (2013.01); B60L 53/14 (2019.02); B60L 53/30 (2019.02); H03K 17/163 (2013.01)

(58) Field of Classification Search
CPC .......................... H03K 17/063; H03K 17/163
See application file for complete search history.

(56) References Cited

U.S. PATENT DOCUMENTS 9,787,301 B2 * 10/2017 Sato ........................ H03K 17/12
10,110,217 B2 * 10/2018 Senda ................... H02M 1/088
(Continued)

FOREIGN PATENT DOCUMENTS

DE 102004036958 A1 3/2006
DE 102008026499 A1 12/2009
(Continued)

OTHER PUBLICATIONS

Puqi Ning, Tianshu Yuan, Han Cao, Lei Li, Yuhui Kang, "The Development of a 1200V/400A SiC Hybrid Module", Proceedings of the 31st International Symposium on Power Semicondutor Devices & ICs, May 19-23, 2019, Shanghai, China, pp. 247-250.

*Primary Examiner* — Tuan T Lam
(74) *Attorney, Agent, or Firm* — Quinn IP Law

(57) ABSTRACT

In one aspect of the disclosure, a variable-current gate driver includes a plurality of inputs for receiving pulse-width-modulation (PWM) control signals transmitted from a processing system. Current sources controlled based on the pulse-width modulation (PWM) signals are coupled to respective gates of at least two transistors of a hybrid switch in the power module (PM) including different semiconductor technologies. The current sources are coupled respectively to at least one other non-gate terminal of the transistors. The current sources provide the slew rate control of the PM using variable current values to compensate for differences in the at least two semiconductor technologies in real-time to reduce switching losses and maximize efficiency.

20 Claims, 9 Drawing Sheets

(51) Int. Cl.
  *B60L 53/30*   (2019.01)
  *H03K 17/06*   (2006.01)
  *H03K 17/16*   (2006.01)

(56)    References Cited

U.S. PATENT DOCUMENTS

| | | | |
|---|---|---|---|
| 10,475,909 B2 * | 11/2019 | Basler | H03K 17/08122 |
| 2013/0257177 A1 | 10/2013 | Jacobson et al. | |
| 2015/0035468 A1 | 2/2015 | Allaert et al. | |
| 2017/0207782 A1 * | 7/2017 | Takizawa | H02M 7/537 |
| 2017/0302152 A1 | 10/2017 | Watanabe et al. | |
| 2018/0026628 A1 * | 1/2018 | Lu | H03K 17/163 |
| | | | 327/108 |
| 2019/0237453 A1 * | 8/2019 | Nagase | H02M 7/5395 |
| 2022/0094347 A1 | 3/2022 | Böke et al. | |
| 2022/0329207 A1 * | 10/2022 | Spina | H03F 3/19 |
| 2023/0275576 A1 * | 8/2023 | Baburske | H03K 17/08128 |
| | | | 327/108 |
| 2024/0022161 A1 * | 1/2024 | Nguyen | H02M 1/08 |
| 2024/0171157 A1 | 5/2024 | Alisar et al. | |

FOREIGN PATENT DOCUMENTS

| | | |
|---|---|---|
| DE | 102013219167 A1 | 10/2014 |
| DE | 102017109591 A1 | 11/2017 |
| DE | 112016003958 T5 | 5/2018 |
| DE | 112017004119 T5 | 5/2019 |
| DE | 102023100167 A1 | 1/2024 |
| EP | 0664613 A2 | 7/1995 |
| EP | 3514929 A1 | 7/2019 |
| JP | 2018082587 A | 5/2018 |
| WO | 02052726 A1 | 7/2002 |

* cited by examiner

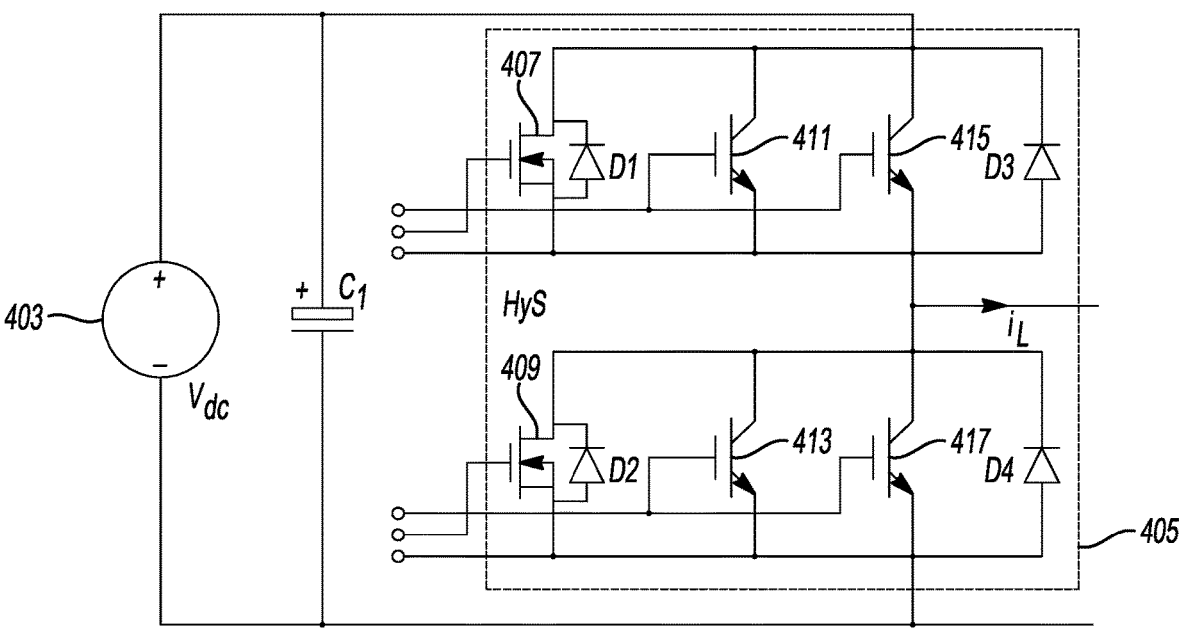
_Fig-4A_
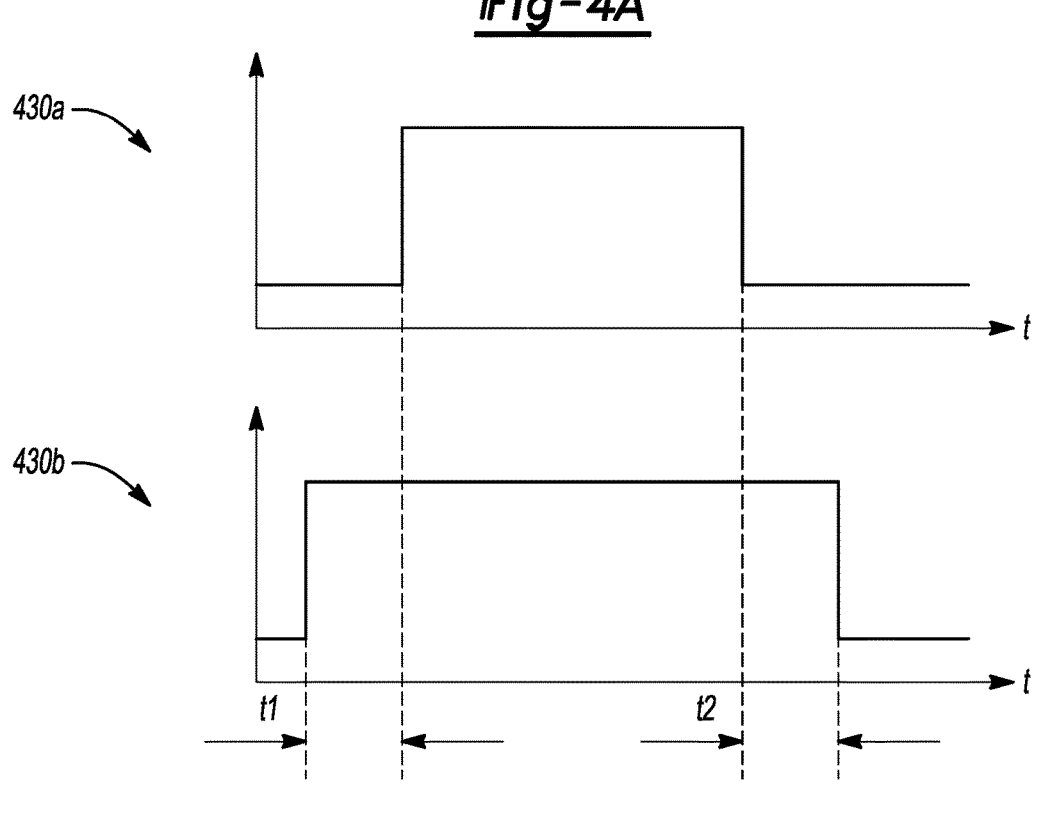
_Fig-4B_

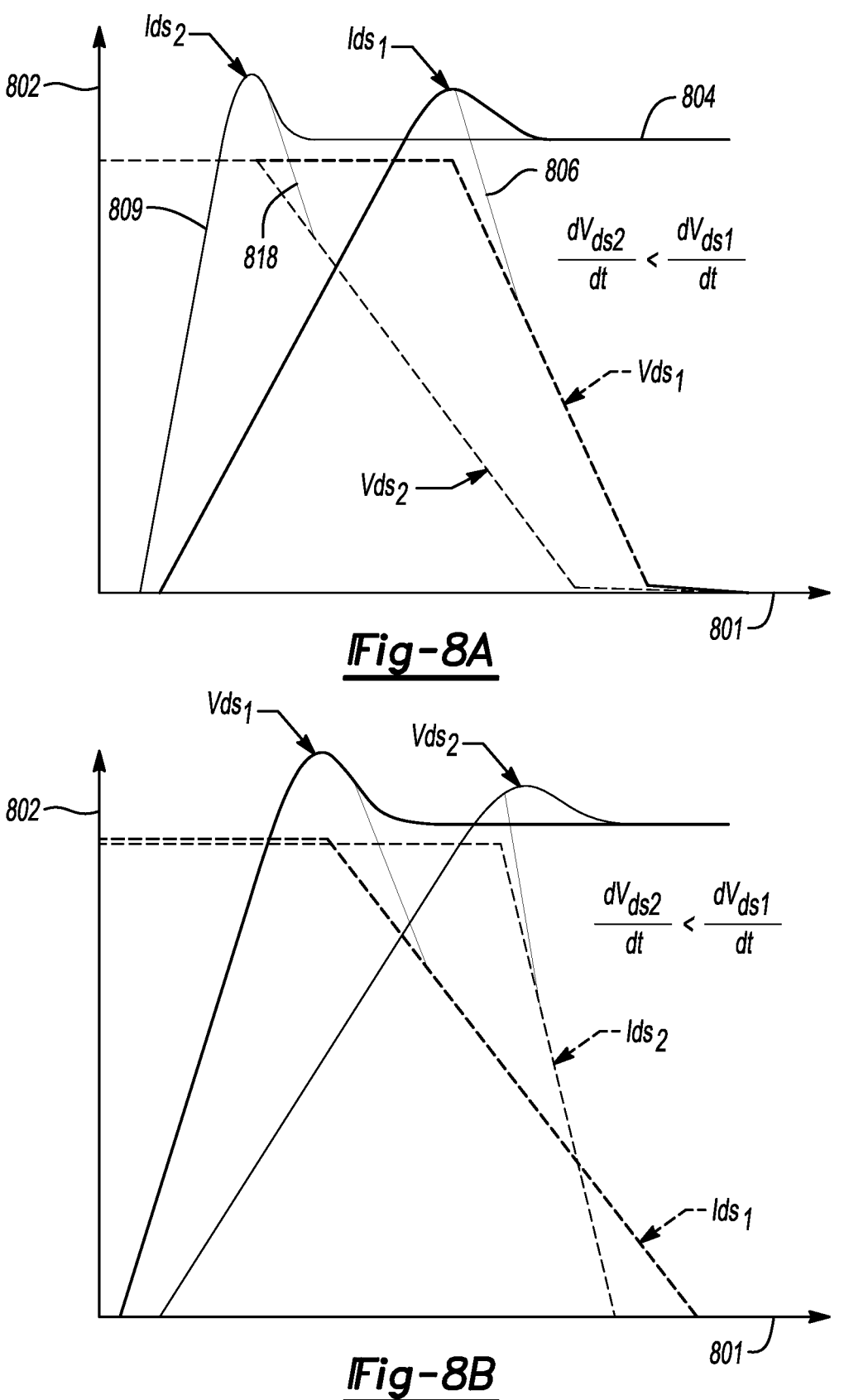
_Fig-8A_
_Fig-8B_

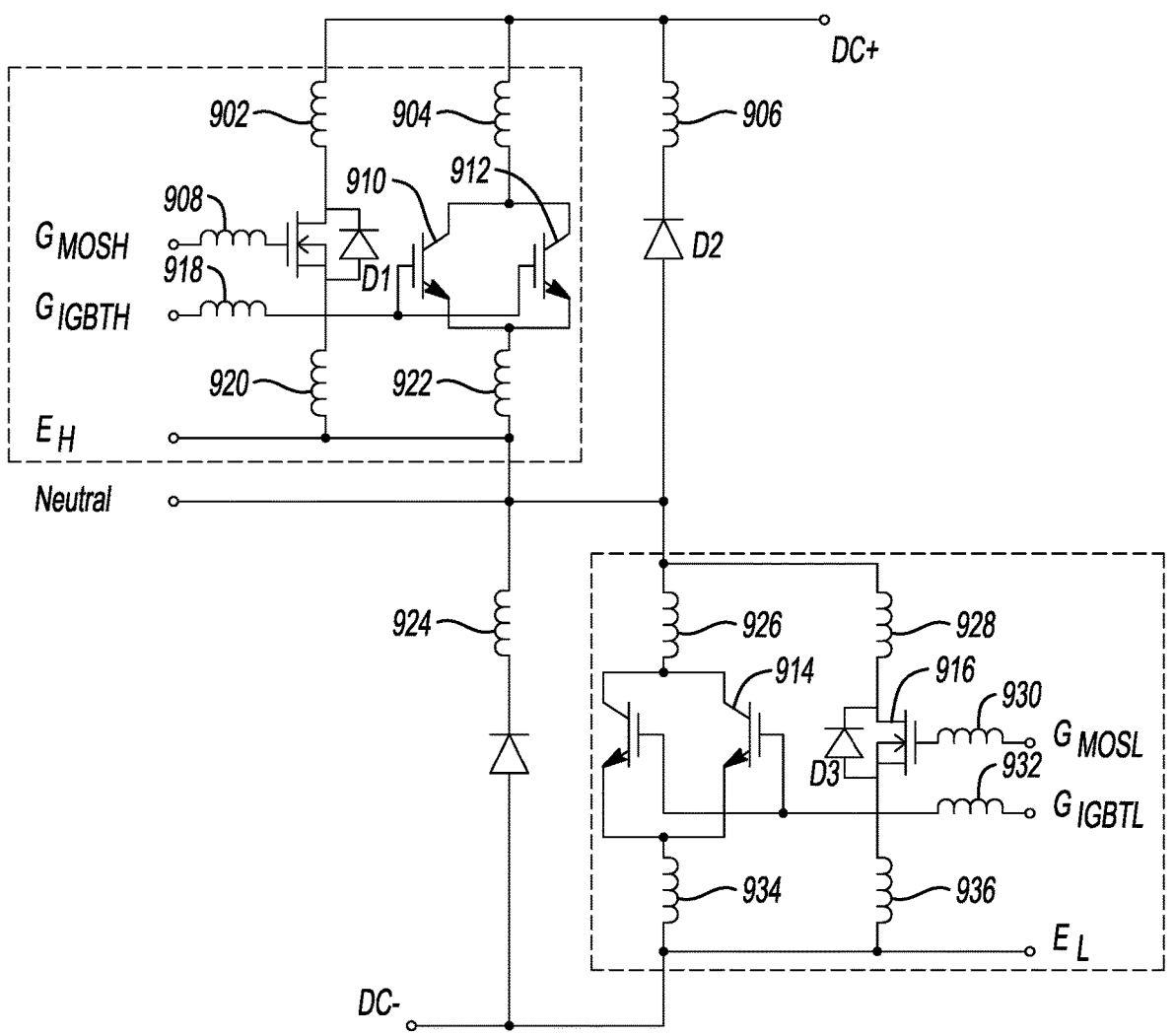
_Fig-9_

VARIABLE SLEW-RATE CURRENT SOURCE GATE DRIVERS FOR HYBRID POWER MODULES

INTRODUCTION

The use of hybrid switches in power modules (PMs) for driving different kinds of motors has become increasingly popular. Hybrid switches include switches formulated out of at least two different semiconductor technologies. Different technologies are employed with the understanding that their unique advantages and disadvantages may be used, with the goal of the design engineer to capitalize on the former while minimizing the latter. The types of different semiconductor technologies for use in PM applications is widespread. One example may include an insulated-gate bipolar transistor (IGBT) in parallel with a power metal-oxide-semiconductor field-effect transistor (MOSFET). The addition of the IGBT may reduce conduction losses in certain operating areas, while concurrently reducing wide bandwidth (WBG) device usage and thereby saving costs. A potentially significant problem with using hybrid transistors or other circuit elements is that the differences between the devices may cause unprecedented second order effects including, for example, current imbalance, false "on" states, overvoltage spikes, overcurrent spikes, electromagnetic interference, and others.

SUMMARY

Apparatuses and methods include gate drive integrated circuits (ICs) that enable inverters and converters to achieve real-time slew rate (SR) control of the hybrid PM using different semiconductor technologies. In one configuration, the PMs may use current sources (CSs) to adjust the respective output currents to the gates of the different switches or dies in the hybrid assembly at different times, e.g., during the desired transition of a switch from one state to another. The output currents thereby achieve multiple SRs with or without pulse width modulation (PWM) gain control. This in turn optimizes the SR to compensate the differences between the hybrid switches and their internal dies to improve current sharing and reduce switching losses, reverse recovery time, overshoot, electromagnetic interference (EMI), and potentially-damage causing bearer current. In an embodiment, a method enables the gate driver to alter SRs based upon operation conditions including direct current (DC) voltage, transistor current(s), phase current(s), junction temperature (s), system temperature(s), and the like. Similarly, the gate driver may use SR control to compensate for part-to-part variations such as threshold voltage (Vth), transistor on resistances, and parasitic stray inductances, to name a few. The disclosed apparatuses may include a galvanically-isolated apparatus based on a variable current source to change the SR between and within a switching event. The advantages of the disclosure may extend to a variety of different semiconductor technologies, including silicon (Si), silicon carbide (SiC), gallium nitride (GaN), gallium oxide ($Ga_2O_3$), diamond transistors, insulated-gate bipolar transistors, metal-oxide semiconductor field effect transistors (MOSFETs), high-electron-mobility transistors (HEMTs), junction field-effect transistors (JFETs), Cascode field-effect transistors (Cascode FETs), and bipolar-junction transistors (BJTs), among others. The gate driver may adjust the SR of an applied voltage to mitigate conflicts between different switches. These conflicts may include current imbalances, reverse recovery events, the MOSFET input capacitance ($C_{ISS}$), stray inductances, overvoltage spikes, overcurrent spikes, and the Miller effect, to name a few.

In short, the principles of the disclosure provide for a balance of different semiconductor devices by enabling SR control to optimize hybrid switch performance taking into account a wide variety of parameters at designated points in time. This principles herein maximize performance of a balance of different semiconductor devices by enabling SR control to optimize the performance of hybrid switches.

Accordingly, in an aspect of the disclosure, a gate driver for providing slew rate (SR) control of a power module (PM) includes a plurality of input ports for receiving pulse-width-modulation (PWM) control signals transmitted from a processing system, and a plurality of current sources controlled by the PWM signals and having outputs coupled to respective gates of at least two transistors of a hybrid switch in the PM, the at least two transistors including different semiconductor technologies, the current sources respectively coupled to at least one other terminal of the at least two transistors, wherein the plurality of current sources are configured to provide the SR control of the PM using variable current values to compensate for the different semiconductor technologies in real time to reduce switching losses and improve PM efficiency.

In various embodiments, the gate driver further includes an output stage of transistors coupled to one or more terminals of another hybrid switch in the PM to apply optimal gate voltage values to reduce conduction loss and electromagnetic interference during switching of the other hybrid switch. The gate driver may include an integrated apparatus physically separate from the processing system and the PM. The SR control may be configured to compensate for capacitance differences between the at least two transistors of the hybrid switch, either with or without using PWM delay control. The SR control is configured to compensate for parasitic inductances between the at least two transistors of the hybrid switch, either with or without using PWM delay control. The SR control may be configured to reduce reverse recovery current between the at least two transistors of the hybrid switch or between a diode coupled between non-gate terminals of one the at least two transistors. In various embodiments, the SR control is further configured to reduce a dead time of the PM either with or without using PWM delay control, to thereby reduce losses in an inverter within the PM or a motor coupled to the PM. In general, dead time is a blanking time period of upper and lower transistors in a single power stage. During this dead time, both transistors are switched off for short period of time to prevent both transistors conducting simultaneously thus causing a short circuit from supply to ground. The SR control may also be configured to reduce a Miller current corresponding to the hybrid switch either with or without using PWM delay control to reduce switching losses. The SR control may further be configured to mitigate a current-sharing imbalance between the at least two transistors of the hybrid switch either with or without using PWM delay control. In some embodiments, the PM includes an inverter module. The inverter module may be operable to drive a motor. One of the at least two transistors of the hybrid switch may include a wide bandgap (WBG) semiconductor and another of the at least two transistors may include a non-WBG transistor. The SR control may thereupon be configured to use feedforward control with look-up tables (LUTs) to alter an SR of the hybrid switch based upon operating conditions. In some embodiments, the operating conditions include one or more of voltage $V_{DS}$, a DC voltage, transistor threshold voltage Vth, transistor on-resistance ($R_{DS}ON$), or a value of one or more gate current sources with the operating conditions. The gate driver may in some embodiments be galvanically isolated from the processing system and the PM.

In another aspect of the disclosure, a vehicle includes a frame defining a body and a passenger cabin, a processing system coupled to a gate driver within the body and configured to send pulse width modulation (PWM) signals to the gate driver, a plurality of current sources in the gate driver under control of the PWM signals, and a polyphase power module (PPPM) including, for each phase of a motor coupled to the PPPM, one or more hybrid sets of switching transistors of different semiconductor technologies, wherein each of the current sources in the gate driver is coupled to a gate and at least one other terminal of a respective one of the hybrid sets of switching transistors, and wherein the current sources are configured to provide slew rate (SR) control of each respective phase of the PPPM using variable gate current values to compensate for the different semiconductor technologies in real time to reduce switching losses and improve PPPM efficiency.

In various embodiments, each of the current sources coupled to the one or more hybrid sets of transistors in each of the phases of the motor is configured to control the SR for effective capacitor discharge, to limit current or voltage overshoots, to control the temperature, current and voltage of the switching transistors, and to maintain the capacitors of the switching transistors and a battery coupled to the PPPM within a safe operating limit. The gate drive may also be configured to control the SR to enable a multi-voltage level turn-off to reduce a soft turn-off time and voltage overshoot when the switch is in a short-circuit mode. The one or more hybrid sets of switching transistors may include an active Miller clamp circuit, a diode integrated across the Miller clamp circuit to protect a gate of the clamp circuit from a Miller effect of remaining transistors in the active Miller clamp circuit. The one or more hybrid sets of switching transistors may include an active Miller clamp circuit and a diode disposed across the Miller clamp circuit, the diode to protect a gate of the clamp circuit from a Miller current of other transistors. The processing system may be further configured to adjust a ratio of a non-wide bandgap (WBG) switch over a WBG switch based on feedback of the PPPM or motor for reducing temperature and switching losses.

BRIEF DESCRIPTION OF THE DRAWINGS

The accompanying drawings, which are incorporated into and constitute a part of this specification, illustrate implementations of the disclosure and together with the description, explain the principles of the disclosure.

FIG. 4A is an example of a power module (PM) incorporating a hybrid switch, the PM driven by a DC voltage source.

FIG. 4B are respective timing diagrams of the PWM voltage switching waveform of a silicon insulated-gate bipolar transistor (Si IGBT) (upper) and a silicon-carbide metal oxide semiconductor field effect transistor (SiC MOS-FET) (lower).

FIG. 8A is a timing diagram illustrating the voltages and currents in switching on a hybrid switch, with and without using dynamic slew change (DSC).

FIG. 8B is a timing diagram illustrating the voltages and currents in switching off a hybrid switch, with and without using dynamic slew change (DSC).

FIG. 9 is an example hybrid switch showing the various parasitic inductances resulting in discrepancies in reverse recovery spikes, current sharing, overvoltage spikes, and overcurrent spikes.

DETAILED DESCRIPTION

Figure 1:
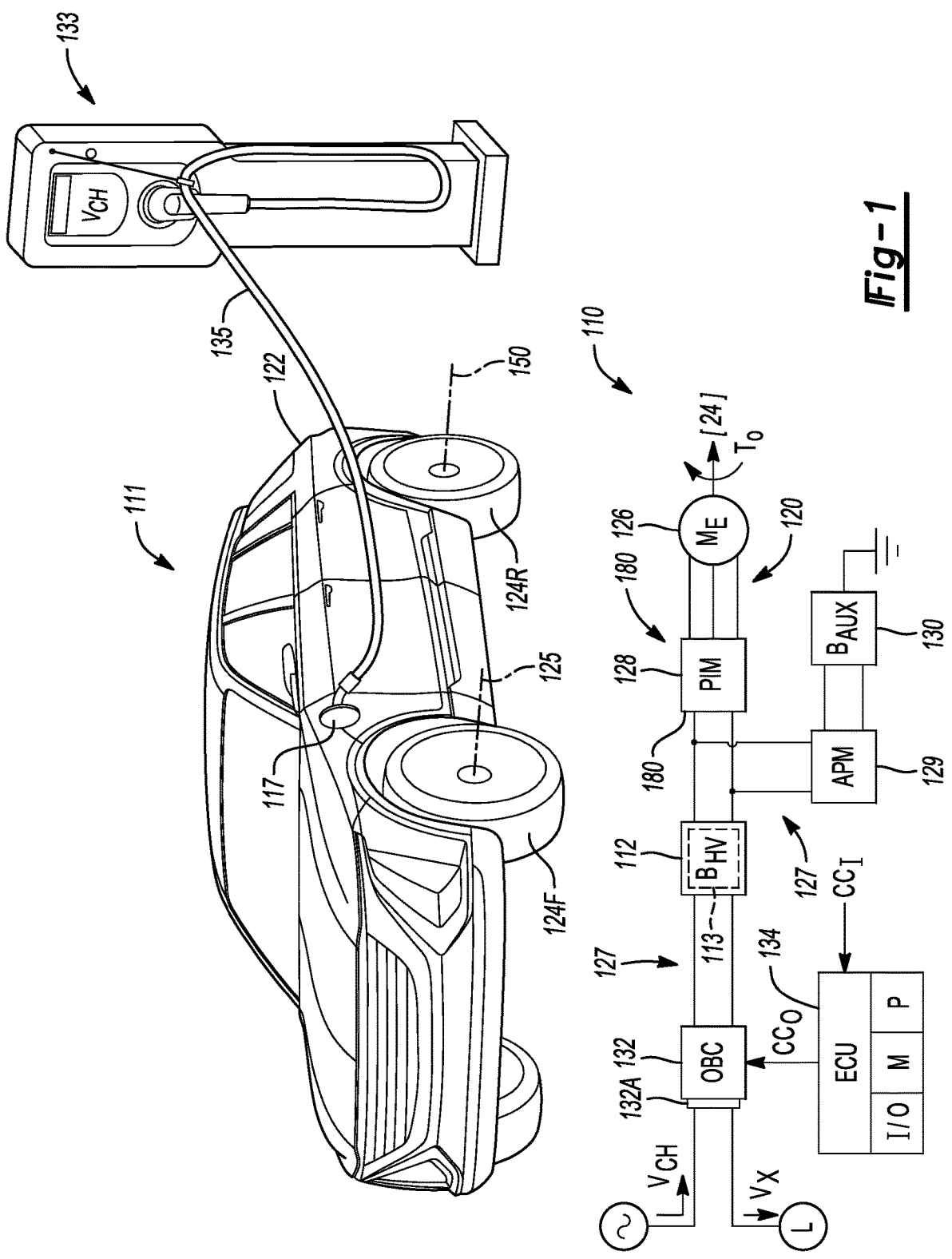
FIG. 1 is a plan view illustration of a vehicle and a battery system coupled to an Electronic Control Unit (ECU) and a power inverter module (PIM) in which the principles of the present disclosure may be implemented.

The present disclosure is susceptible of embodiment in many different forms. Representative examples of the disclosure are shown in the drawings and described herein in detail as non-limiting examples of the disclosed principles. To that end, elements and limitations described in the Abstract, Introduction, Summary, and Detailed Description sections, but not explicitly set forth in the claims, should not be incorporated into the claims, singly or collectively, by implication, inference, or otherwise.

While the principles of the present disclosure have wide application to diverse architectures involving optimizing switching performance, for purposes of example, electric vehicles are considered. It should be understood, however, that the disclosed gate driver apparatus has application to different implementations using hybrid semiconductor technology, e.g., to drive an electric motor in connection with a machine, such as by using a polyphase power inverter module (PPIM) for driving a three-phase electric motor. To that end, FIG. 1 is a plan view illustration of a vehicle and a battery system coupled to an Electronic Control Unit (ECU) and a power inverter module (PIM) in which the principles of the present disclosure may be implemented. In the embodiment of FIG. 1, an ECU performs the calibration internal to the vehicle. Advantageously, whenever it is deemed that the calibration has been decayed for whatever reason, or even on power-on, the ECU may apply the principles of the present disclosure to recalibrate each camera on the vehicle. That is to say, calibration may be performed on the vehicle using the described on-board electronics.

While an electric vehicle is shown in FIG. 1, it will be appreciated that the disclosure is not so limited and that the internal calibration procedures may be performed by each vehicle having the appropriate programmed circuitry. While the above hysteresis models may apply to a number of different physical configurations, FIG. 1 shows one such example. FIG. 1 depicts an electrified powertrain system 110 having a high-voltage battery pack ($B_{HV}$) 112 for which SOC estimations may be made. In a non-limiting example, the battery pack 112 may be embodied as a high-capacity battery having a voltage capability of about 400-800 volts or more, with the actual voltage capability of the battery pack 112 provided based on a desired operating/SOC range, gross weight, and power rating of a load connected to the battery pack 112. In a possible construction, the battery pack 112 may be a propulsion battery pack generally composed of an array of lithium-ion or lithium-ion polymer rechargeable electrochemical battery cells, which may be a cylindrical battery cell. The present teachings may also be applied to prismatic battery cells, and to pouch-style battery cells in possible configurations, and thus the cylindrical battery cell is exemplary without being limiting.

Although internal details of the battery cells in battery pack 112 are omitted for illustrative simplicity, those skilled in the art will appreciate that the battery cells contain within the cell cavity an electrolyte material, working electrodes in the form of a cathode and an anode, and a permeable separator (not shown), which are collectively enclosed inside an electrically-insulated can or casing. Grouped battery cells may be connected in series or parallel through use of an electrical interconnect board and related buses, sensing hardware, and power electronics (not shown but well understood in the art). An application-specific number of the battery cells in battery pack 112 may be arranged relative to the battery tray 113 in columns and rows. In a nominal "xyz" Cartesian reference frame, for instance, the battery tray 113 when viewed from above or below may have a length (x-dimension) and a width (y-direction), with a height (z-dimension) extending in an orthogonal direction away from the battery tray 113.

In a representative use case, the electrified powertrain system 110 may be used as part of an EV 111 or another mobile system. As shown, the EV 111 may be embodied as a battery electric vehicle, with the present teachings also being extendable to plug-in hybrid electric vehicles. Alternatively, the electrified powertrain system 110 may be used as part of another mobile system such as but not limited to a rail vehicle, aircraft, marine vessel, robot, farm equipment, etc. Likewise, the electrified powertrain system 110 may be stationary, such as in the case of a powerplant, hoist, drive belt, or conveyor system. Therefore, the electrified powertrain system 110 in the representative vehicular embodiment of FIG. 1 is intended to be illustrative of the present teachings and not limiting thereof.

The EV 111 shown in FIG. 1 includes a vehicle body 122. The vehicle body 122 may include a frame within the body 122 to define areas for placement of mechanical and electrical components, as well as a passenger cabin. The EV may further include road wheels 124F and 124R, with "F" and "R" indicating the respective front and rear positions. The road wheels 124F and 124R rotate about respective axes 125 and 150, with the road wheels 124F, the road wheels 124R, or both being powered by output torque (arrow $T_O$) from a rotary electric machine (ME) 126 of the electrified powertrain system 110 as indicated by arrow [24]. The road wheels 124F and 124R thus represent a mechanical load in this embodiment, with other possible mechanical loads being possible in different host systems. To that end, the electrified powertrain system 110 includes a power inverter module (PIM) 128 (also referenced herein as a power module (PM)) and the high-voltage battery pack 112, e.g., a multi-cell lithium-ion propulsion battery or a battery having another application-suitable chemistry, both of which are arranged on a high-voltage DC bus 127. As appreciated in the art, the PIM 128 includes a DC side (180) and an alternating current (AC) side 120, with the latter being connected to individual phase windings (not shown) of the rotary electric machine 126 when the rotary electric machine 126 is configured as a polyphase rotary electric machine in the form of a propulsion or traction motor as shown.

The battery pack 112 of FIG. 1 in turn is connected to the DC side 180 of the PIM 128, such that a battery voltage from the battery pack 112 is provided to the power inverter module (PIM) 128 during propulsion modes of the EV 111. The PIM 128, or more precisely a set of semiconductor switches (not shown) residing therein, are controlled via pulse width modulation (PWM), pulse density modulation (PDM), or other suitable switching control techniques to invert a DC input voltage on the DC bus 127 into an AC output voltage suitable for energizing a high-voltage AC bus 120. As noted, the PIM 128 may also be referred to simply as a power module (PM), which may include an inverter or converter. High-speed switching of the resident semiconductor switches of the PIM 128 energizes the rotary electric machine 126 to thereby cause the rotary electric machine 126 to deliver the output torque (arrow $T_O$) as a motor drive torque to one or more of the road wheels 124F and/or 124R in another coupled mechanical load in other implementations.

Electrical components of the electrified powertrain system 110 may also include an accessory power module (APM) 129 and an auxiliary battery ($B_{AUX}$) 130. The APM 129 is configured as a DC-DC converter that is connected to the DC bus 127, as appreciated in the art. In operation, the APM 129 is capable, via internal switching and voltage transformation, of reducing a voltage level on the DC bus 127 to a lower level suitable for charging the auxiliary battery 130 and/or supplying low-voltage power to one or more accessories (not shown) such as lights, displays, etc. Thus, "high-voltage" refers to voltage levels well in excess of typical 12-15V low/auxiliary voltage levels, with 400V or more being an exemplary high-voltage level in some embodiments of the battery pack 112.

In some configurations, the electrified powertrain system 110 of FIG. 1 may include an on-board charger (OBC) 132 that is selectively connectable to an offboard charging station 133 via an input/output (I/O) block 132A during a charging mode during which the battery pack 112 is recharged by an AC charging voltage (VCH) from the offboard charging station 133. The I/O block 132 is connectable to a charging port 117 on the vehicle body 122. For instance, a charging cable 135 may be connected to the charging port 117, e.g., via an SAE J1772 connection. The electrified powertrain system 110 may also be configured to selectively receive a DC charging voltage in one or more embodiments as appreciated in the art, in which case the OBC 132 would be selectively bypassed using circuitry (not shown), e.g., that may be used to charge and/or discharge the battery pack 112 gradually for performing various functions, such as testing the SOC. The OBC 132 could also operate in different modes, including a charging mode during which the OBC 132 receives the AC charging voltage ($V_{CH}$) from the offboard charging station 133 to recharge the battery pack 112 after a low charge indicator light displays on the dashboard, and a discharging mode, represented by arrow $V_X$, during which the OBC 132 offloads power from the battery pack 112 to an external AC electrical load (L). In this manner, the OBC 132 may embody a bidirectional charger.

Still referring to FIG. 1, the electrified powertrain system 110 may also include an electronic control unit (ECU) 134. The ECU 134 is operable for regulating ongoing operation of the electrified powertrain system 110 via transmission of electronic control signals (arrow $CC_O$). The ECU 134 does so in response to electronic input signals (arrow $CC_I$). Such input signals (arrow $CC_I$) may be actively communicated or passively detected in different embodiments, such that the ECU 134 is operable for determining a particular mode of operation. In response, the ECU 134 controls operation of the electrified powertrain system 110. Thus, the ECU and its accompanying components may act as a BMS for performing functions including estimating the SOC, etc.

To that end, the ECU 134 may be equipped with one or more processors (P), e.g., logic circuits, combinational logic circuit(s), Application Specific Integrated Circuit(s) (ASIC), electronic circuit(s), central processing unit(s), semiconductor IC devices, etc., as well as input/output (I/O) circuit(s), appropriate signal conditioning and buffer circuitry, and other components such as a high-speed clock to provide the described SOC functionality in prior figures, as well as different functions identified by the CC input signal. The ECU 134 also includes an associated computer-readable storage medium, i.e., memory (M) inclusive of read only, programmable read only, random access, a hard drive, etc., whether resident, remote or a combination of both. Control routines, including code for executing the SOC model with hysteresis, are executed by the processor to monitor relevant inputs from sensing devices and other networked control modules (not shown), and to execute control and diagnostic routines to govern operation of the electrified powertrain system 110. The I/O circuits may be directly coupled to the ECU 134, along with memory M and one or more processors P for executing code that estimates SOC. In an aspect, the BMS system may collectively be realized as ECU 134, OBC 132 and bus 127. OBC 132 and bus 127 may be an apparatus within the BMS, or included as part of the BMS that is enabled to be connected to the outer terminals of battery pack 112 to perform the functions recited herein. In some implementations, the BMS may be coupled directly with the battery pack.

EV 111 may, like other vehicles, include a dashboard implanted within or otherwise connected to the body of EV 111. The body houses a cabin where the driver and occupants reside. The apparatus discussed above may include control signals to the dashboard and conversion circuitry to enable the driver to assess the SOC remaining based on an amount or percentage of charge remaining, an estimated time that the vehicle will die or imminently needs recharging, and other data. At least some of these aspects may be computed by the BMS, including ECU 134 and its associated processor P running code from memory M. Messages may be sent via the I/O circuit to other parts of the vehicle, via $CC_O$ or another connection not specifically shown.

In another embodiment, ECU 134 along with its I/O, memory and processor may additionally or alternatively be used to calibrate and recalibrate each of the cameras in the EV, or selected ones. In this case, the flow diagrams above may be run on the processor and the ECU 134 may be appropriately connected to carry out calibrations for each of the cameras. This may occur during suspected miscalibrations caused by force events, or it may simply be recalibrated every X times the driver turns on the EV 111. It should be noted again that another type of combustion based, or hybrid vehicle may be used in this embodiment. This embodiment also obviates the expensive and time-consuming need to implement calibrations independently for each of the vehicles at startup. ECU 134 may be coupled to each of the cameras via a hardwire or networked connection, or it may be connected to selected cameras.

In the above example, the PIM 128 (or more simply, the PM) may include a set of semiconductor switches driven by a modulation technique such as PWM (although other suitable modulation techniques such as PDM may be used). In other configurations, the ECU or a microcontroller unit (MCU) therein (e.g., processor P) may also be used to govern the transmission of modulated signals. The semiconductor switches of PIM 128 may include power transistors, and the modulation technique used to drive them may include intermediary circuitry to suitably decode the PWM signals where needed and to adjust the rail-to-rail voltage swing from power used by logic circuits (e.g., 0 to 5 volts, or the like) to the higher voltages needed by a gate driver to switch the power transistors that drive the rotary electric machine 126. With reference to the PIM 128, a gate driver may be employed to turn the power transistors/switches on and off.

The gate driver apparatus, described further below, turns the power transistors on and off to convert the DC-based power to AC-based power. With existing implementations, faster switching by the gate driver of the power transistors may reduce switching losses and improve maximum power capability, but at a cost. The faster switching also increases overshoot and slew rate (SR). Slew rate as noted embodies the rate of change of voltage or current of the switching transistor (e.g., dV/dt, dI/dt, where V is voltage in volts, and I is current in Amperes (Amps). This increased overshoot leads to problems in traditional motor implementations. They include (i) higher electrical stress on power switches, that may cause physical damage, (ii) higher ringing, conductive, and radiated electromagnetic interference (EMI) that may cause errors in intended voltage/logic values, or even physical damage to the PM or motor if the EMI is severe enough, and (iii) higher motor terminal voltage overshoot (partial-discharge-inception-voltage or "PDIV") and bearing current.

Figure 2:
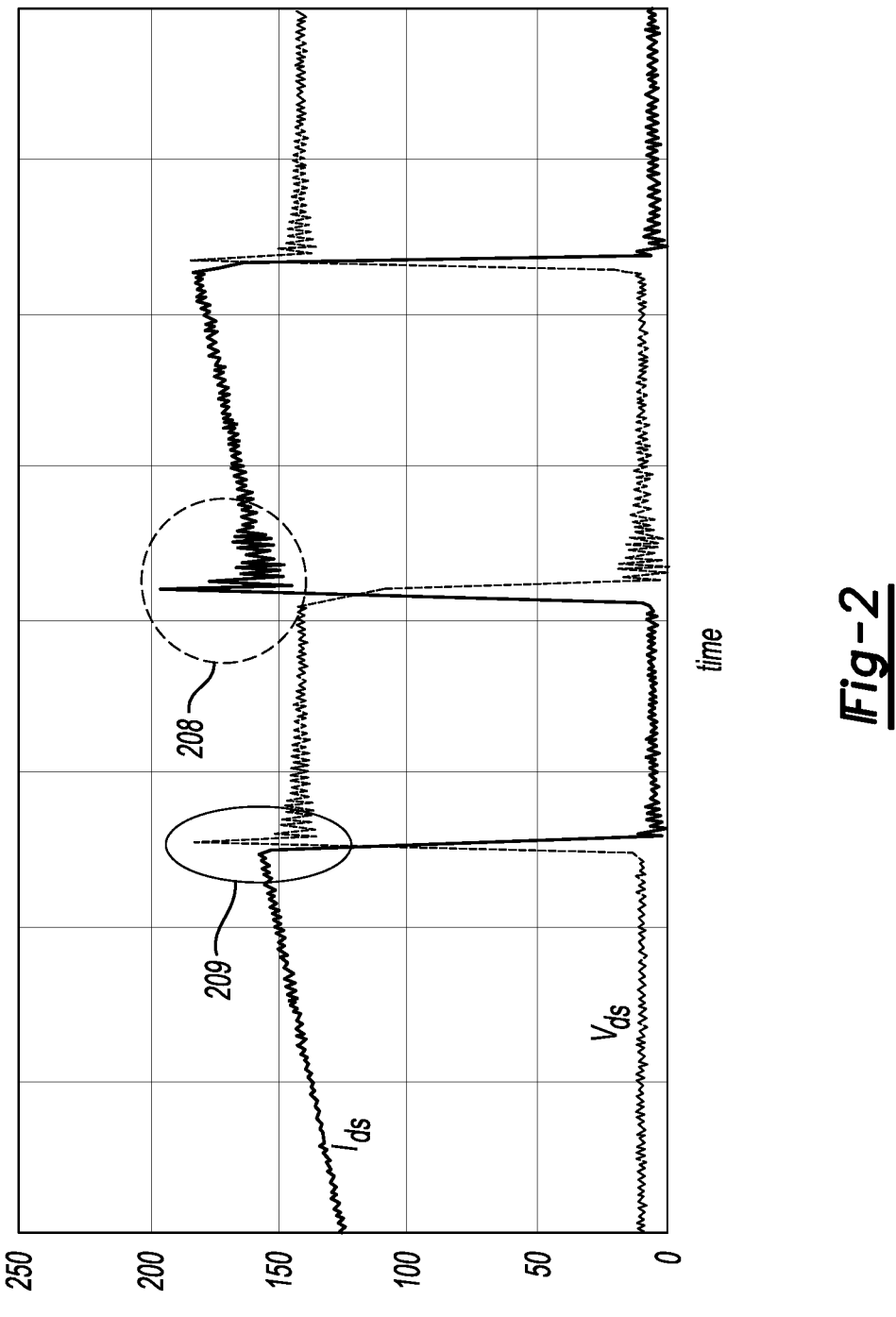
FIG. 2 is a timing diagram illustrating an example of current and voltage overshoot and ringing resulting from high switching speeds of power transistors in a power module (PM).

FIG. 2 is a timing diagram 200 illustrating current and voltage overshoot and ringing resulting from high switching speeds of power transistors in a power module (PM). The horizontal axis represents time, and the vertical axis represents amplitude (volts in the case of voltage, Amperes (Amps) in the case of current). When the circuit element is switched at high speeds, large overshoots followed by ringing in the drain-to-source voltage Vds and the drain current Ids become apparent. The first visible turn-off point causes the voltage Vds to generate a large voltage spike 209, with visible ringing in Vds prior to settling to a value closer to steady-state. Similarly, at the next stage wherein the switch is turned on and Vds rapidly returns to a value near zero, the high-speed Ids turn-on results in current spike 208, followed by ringing, or wavering back and forth as shown in the waveform until returning to its equilibrium value. The overshoots and ringing in these waveforms also result in the generation of EMI and other second-order effects, which may interfere with surrounding signals and result in higher-than-usual current values across the PM.

Exceedingly high ringing values may also result in damage to the circuit. The gate driver turns the power semiconductors on and off to convert electrical power between direct current (DC) and alternating current (AC). Faster switching times may also be advantageous in that switching loss is reduced and maximum power capability may be achieved. However, in existing implementations, faster switching also increases voltage and current overshoot as exemplified in FIG. 2, which in turn causes the above-described problems.

Figure 3:
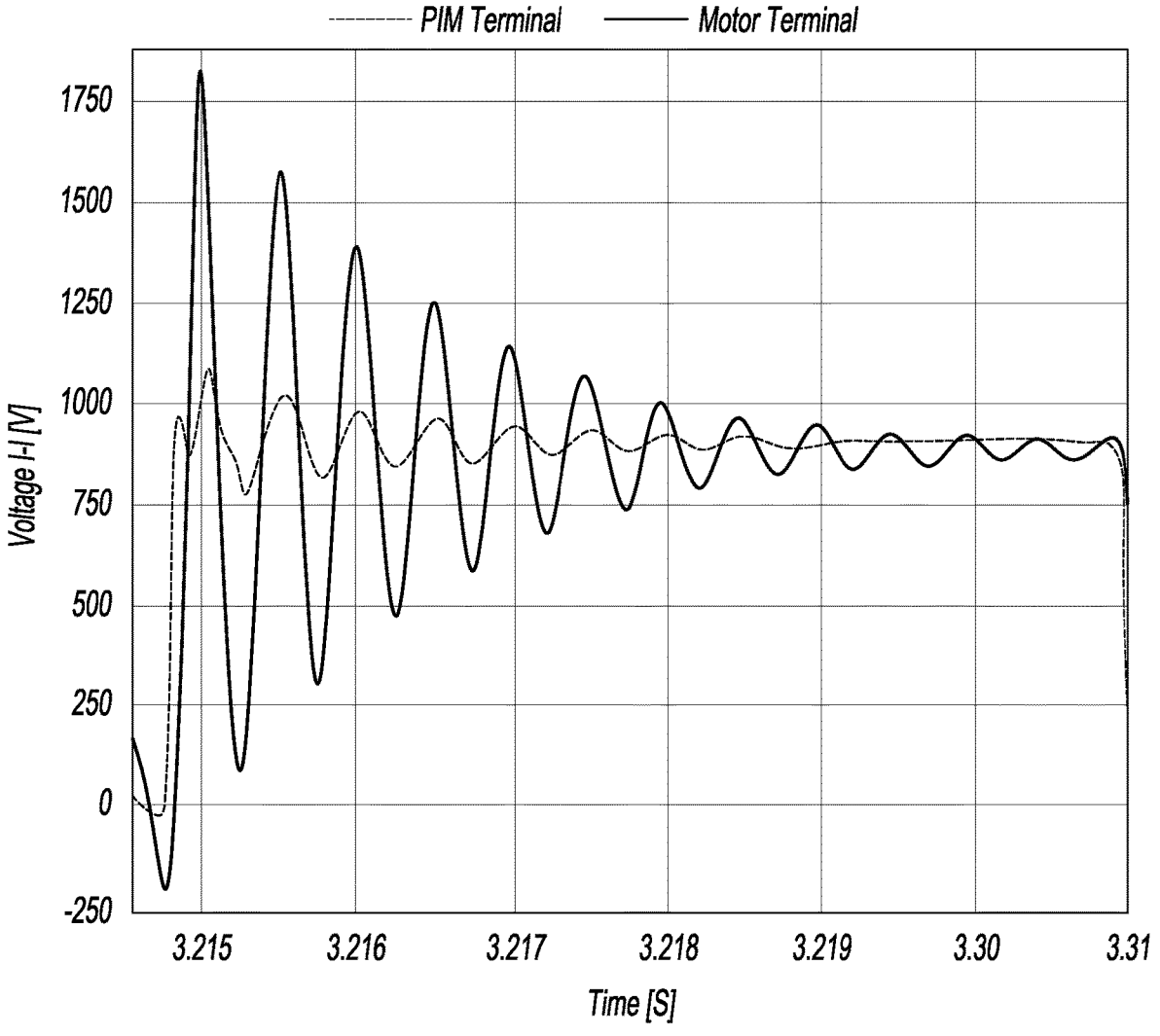
FIG. 3 is a timing diagram illustrating an example of a winding overvoltage resulting from a fast switching speed driving an electric motor.

Still another problem in existing implementations includes winding overvoltage. FIG. 3 is a timing diagram illustrating an example of a winding overvoltage resulting from a voltage with a fast slew rate switching a phase of an electric motor. The horizontal axis in FIG. 3 represents time in seconds. The vertical axis in FIG. 3 represents voltage in volts. The solid line represents a waveform for the voltage of the motor terminal and more specifically the motor's line-to-line voltage at a fixed number of revolutions-per-minute, while the dashed line represents the output of the PIM driving the motor. Referring initially to the left side of the drawing, the voltage of the PIM terminal switches at a high speed from just beneath zero volts to a positive value (in this example, almost 1000 volts). This sudden switch causes the maximum line-line voltage of the motor to achieve a value of approximately 1700 volts. While the actual overshoot may vary widely depending on the details of the switches and the configuration of the motor, the apparatus may not be rated to withstand such high voltages, resulting in potential damage to the equipment and at best, an imbalance in the operation of the motor. As the PIM terminal slowly reaches an equilibrium point at about 3.219 seconds, the winding overvoltage also takes time to reach a stable value. Winding overvoltage resulting from an excessive SR at the PIM terminal may cause functional and operational problems to the motor.

In addition to the above-referenced problems associated with PMs and motors, it is well understood that fast switching periods may also create undesirable common mode voltages and currents in the motor, which currents are proportional to the rate of change (dV/dt) of the switching voltage. These common mode currents, in turn, may lead to bearing current which may damage the motor. In short, failures due to bearing currents often result from these common mode artifacts, which may result in damage to the bearings.

As noted, to reap the benefits of different semiconductor technologies while attempting to address the above deficiencies, hybrid semiconductor circuits for use in switching have been developed or proposed in the literature. As further noted, the principles of the present disclosure may apply to a variety of two or more types of semiconductors for use in power-switching application, including switching circuits incorporating two or more of silicon (Si), silicon carbide (SiC), gallium nitride (GaN), gallium oxide ($Ga_2O_3$), diamond transistors, insulated-gate bipolar transistors, metal-oxide semiconductor field effect transistors (MOSFETs), high-electron-mobility transistors (HEMTs), junction field-effect transistors (JFETs), Cascode field-effect transistors (Cascode FETs), and bipolar-junction transistors (BJTs), to name a few. As noted, using a hybrid switch that incorporates a power MOSFET in parallel with an IGBT allows for considerable SR improvement and a reduction in cost savings. Problems with these and other hybrid solutions nonetheless persist in the current state of the art. A few of the second order effects caused by integrating different semiconductor technologies, such as current imbalances, false ONs, overvoltage spikes, and EMI were alluded to above. Furthermore, traditional gate drivers provide one or a few slew rates at best, the latter of which are limited to handling extreme conditions rather than regular operational use.

To meet these challenges, one aspect of the disclosure takes a different tact altogether, driving the hybrid power transistors with a current, rather than a voltage. This current may be used to create piecewise functions that effectively "tune" the turning on and turning off of each hybrid switch in a manner that combines the efficiency of fast switching with the reduction of undesirable artifacts such as overshoot, ringing, and EMI.

Accordingly, another aspect of the disclosure combines the advantages of the use of hybrid switches with unique circuits that provide in or near-real time SR control of the block of hybrid PMs on a regular operational basis. In various embodiments, the principles of the disclosure use current sources (CSs) to optimally adjust the output currents to the gates of the switching transistors or to the dies of the hybrid PMs. The use of current sources for this purpose enables the PM to achieve multiple SRs, with or without PWM delay control. The availability of multiple SRs, in turn, enables different such SRs to compensate for fundamental differences between the hybrid switches and their internal dies and thereby eliminate or reduce the aforementioned deficiencies inherent in traditional switching techniques. The combination of the real-time SR control with the benefits of the hybrid power switches has benefits. To name a few, they include improved current sharing to obtain a suitable balance between switches or transistor dies, reduced losses incurred during switching, reduced time periods and amplitudes of reverse recovery events, reduced overshoot, reduced EMI, and reduced bearing current.

FIG. 4A is an example of a power module (PM) incorporating hybrid switches 405 and driven by a DC voltage source 403. The hybrid switches 405 integrate switches of different technologies (such as those noted above) to enhance their mutual advantages and compensate their conflicts. The PM in this example is connected to a DC voltage source 403 in parallel with a parallel capacitor C1. Hybrid switches include SiC MOSFETs 407 and 409, whose drain and source include in parallel respective diodes D1 and D2. The other hybrid switches include IGBTs 411, 415, 413 and 417. A diode D3 is included across the non-gate terminals of transistors 407, 411 and 415. A diode D4 is included across the non-gate terminals of transistors 409, 413, and 417. As described further below, a variable current gate driver (VCGD) controls the timing of the input PWM signals and the output gate current to optimize the switching speeds of the different transistors. One objective is to allow a zero-voltage switching (ZVS) of the IGBT and thereby improve the overall switching speed, loss, overshoot, reverse recovery ringing EMI, dV/dt, dI/dt, and common mode and bearing currents. In this case, Si IGBT semiconductor technology is advantageously inexpensive, but it is associated with a higher switching loss to larger parasitic capacitances and tail currents. By contrast, SiC MOSFET technology has a lower switching loss and improved thermal conductivity, but at a higher cost. The PWM circuit driving the gate driver may do so in a way that enhances the benefits specific to each transistor technology.

It should be noted that, while the PM in this example includes silicon diodes D3 and D4 across the respective collectors and emitters of IGBTs 415 and 417, other embodiments need not include these diodes. Many different configurations are possible for various semiconductor technologies, and each of which is intended to fall within the spirit and scope of the present disclosure.

FIG. 4B is a timing diagram of the PWM switching pulse 430a of a silicon insulate-gate bipolar transistor (IGBT) compared with the PWM pulse 430b of a silicon carbide MOSFET, such as used in the PM 403 in FIG. 4A. Ideally, the processing system would output square waves having a width dependent in part on the properties of the IGBT (e.g., gate size, transistor dimensions, etc.) and the desired switching speeds and frequencies. Also shown in FIG. 4b, as noted, is the PWM timing diagram for a corresponding SiC MOSFET. There exists a noticeable delay time t1 between the PWM switching time of the MOSFET versus that of the IGBT. Likewise, a delay time t2 also exists when comparing the opposite side of the PWM pulse to the MOSFET versus the IGBT. In a manner further discussed below, the VCGD may receive the PWMs signal and use the delays and control the pulse width of these signals using the respective gate current, discussed below, in order to adjust the switching speeds, losses and overshoots of the respective hybrid transistors. That is to say, the VCGD may control the gate current and PWM output in a manner that optimizes the respective switching speeds of the transistors using different semiconductor technologies and may introduce PWM delays that align or otherwise orient the pulses.

In an aspect of the disclosure, a variable current gate driver (VCGD) is used to drive hybrid PMs including switches composed of different semiconductor technologies. Unlike existing approaches, the VCGD uses current sources (CSs) to provide variable output currents to the gates of the individual switches, dies, or combination of the hybrid PM to precisely control switching SR in or near real-time. In various embodiments, the use of the VCGD may be combined with the traditional PWM delay control to further improve performance. The gate driver's output circuit may be supplied by different voltage sources designed to be optimal to the different semiconductor technologies to further reduce conduction loss and electromagnetic interference (EMI).

Figure 5:
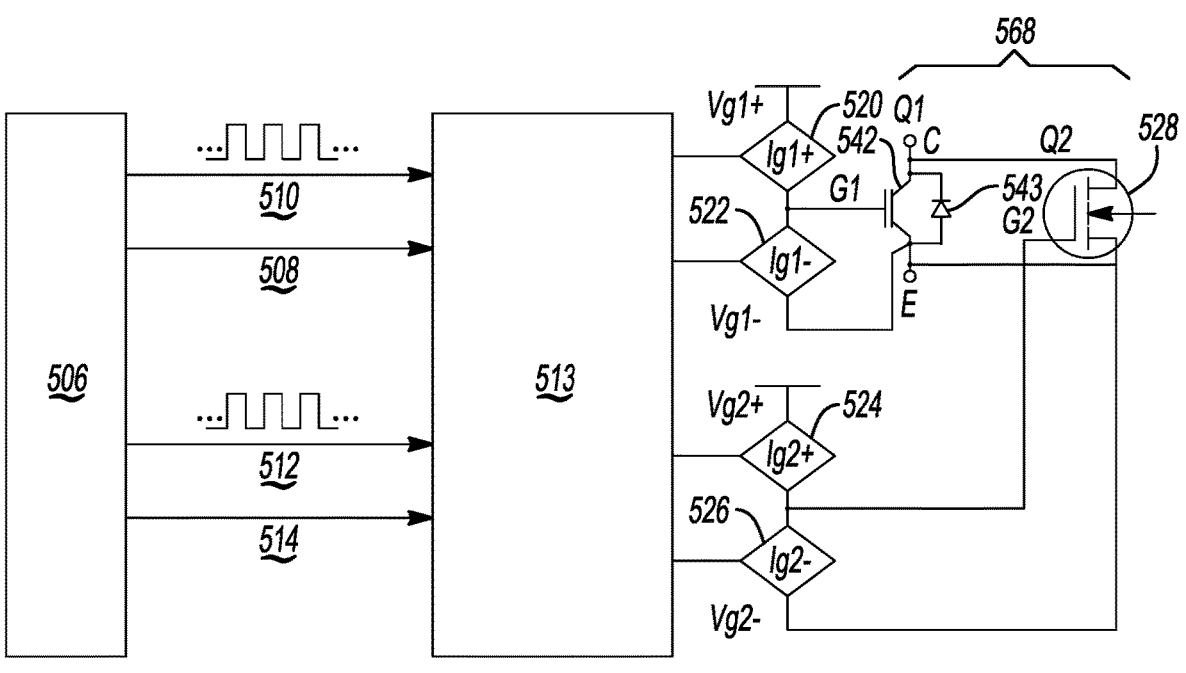
FIG. 5 is a variable-current gate driver (VCGD) for use in controlling current sharing, and reducing loss, overshoot, and the rates of change of voltage (dV/dt) and current (dI/dt) in the hybrid switches of a power module (PM).

FIG. 5 is a variable-current gate driver (VCGD) for use in controlling current sharing, and reducing loss, overshoot, and the rates of change of voltage (dV/dt) and current (dI/dt) in the hybrid switches of a power module (PM), in accordance with an aspect of the disclosure. The processing system includes micro-controller unit (MCU) 506, whether an autonomous integrated circuit or set thereof, or as included in an electronic control unit (ECU) of a vehicle. It should again be underscored that the principles of this disclosure are not so limited, and other networks in different implementations may benefit from the principles of this disclosure.

With reference to FIG. 5, the MCU 506 transmits PWM signals 510 and 512, with respective IG selection code signals 508 and 514 transmitted in parallel with PWM signals 510 and 512 along peripheral interfaces, into a gate driver 513. The gate driver 513 may be a single or multiple gate driver and may include intermediate control and switching circuitry for receiving and processing the initial PWM signals, and converting them to a specified format as needed, depending on the configuration and on the hybrid semiconductor technology to be driven. One example includes increasing a total voltage swing suitable for use by subsequent stages. One such stage includes the current sources 520 (Ig1+) and 522 (Ig1−) and current sources 524 (Ig2+) and 526 (Ig2−) coupled at the output of gate driver 513 to gate G1 and emitter E of IGBT 542. IGBT 542 may be a single IGBT or multiple IGBTs in parallel with individual or parallelled gates. MOSFET 528 may be a single MOSFET or multiple MOSFETs in parallel with individual or parallelled gates. The hybrid switch 568 in this embodiment includes IGBT 542 and MOSFET 528. The gate driver 513 together with the current sources coupled at its output form a variable-current gate driver (VCGD). Current sources 520 and 522 are coupled together at gate G1. Current source 520 is further coupled to node with voltage Vg1+. Current source 522 is coupled to the emitter E of the IGBT 542, at voltage Vg1−. Current sources 524 and 526 are coupled together at G2 for sending or sinking a gate current to the MOSFET. Current source 524 is further coupled to a node at a voltage of Vg2+, and current source 526 is coupled to the other non-gate terminal of the MOSFET at a voltage Vg2−. Current sources 520, 522, 524 and 526 are shown controlling the terminals of the hybrid switch 568. The hybrid switch 568 includes IGBT 542 and power MOSFET 528. Diode 543 is coupled between the collector C and emitter E nodes of the IGBT 542. In this configuration, gate driver 513 is merely shown as driving a single stage (hybrid switch 568) for simplicity and to avoid unduly obscuring the concepts of the disclosure. However, in other embodiments, gate driver 513 may be driving more than one stage, such as three stages in a polyphase electric motor. Nodes Q1 and Q2 are configured such that two non-gate nodes of the transistors are coupled together. Thus, the collector C of IGBT 542 is coupled directly to Q1 and Q2. Current sources 520 and 522, which may also be interpreted as a single current source, may control the flow of the current flowing through gate G1 of IGBT 542. The node voltage Vg1− of current source 522 is the same as that of emitter E of IGBT 542, because the terminals are physically connected. The emitter is connected directly in this embodiment to the drain or source of the MOSFET, depending on whether the MOSFET is p-type or n-type. It is noteworthy that gate current sources 524 and 526 may also be interpreted as a single current source, controlling the flow of current into and out of the gate G2 of MOSFET 528.

As noted above, gate driver 513 is configured to control its output for each switch of the hybrid power module (or each die of the switch, as described below). One significant advantage of the VCGD in FIG. 5 is that the different current sources 520, 522, 524, and 526 may be supplied by different voltage sources optimal to the diverse types of semiconductor technologies in a manner that optimally reduces conduction loss and EMI. For example, the current sources 520 and 522 driving a SiC-based device may set Vg1+ at 19 volts, and Vg1− at minus 5 volts. Additional example values for SiC may be 15 volts/−3 volts. For gallium nitride (GaN), the values may be lower at −5 volts and 0 volts, respectively. For an IGBT, the voltage swing may be 16 volts/−9 volts, and so on. A similar scenario applies for voltages Vg2+ and Vg2−, and potentially other voltages in the case where the gate driver 513 is driving multiple loads. In addition, in some embodiments, current source 520 may include one or a plurality of transistors or circuit elements. The same holds true for current sources 524 and 526. Further, additional current sources, or current source arrays, may in some cases be deployed.

Figure 6:
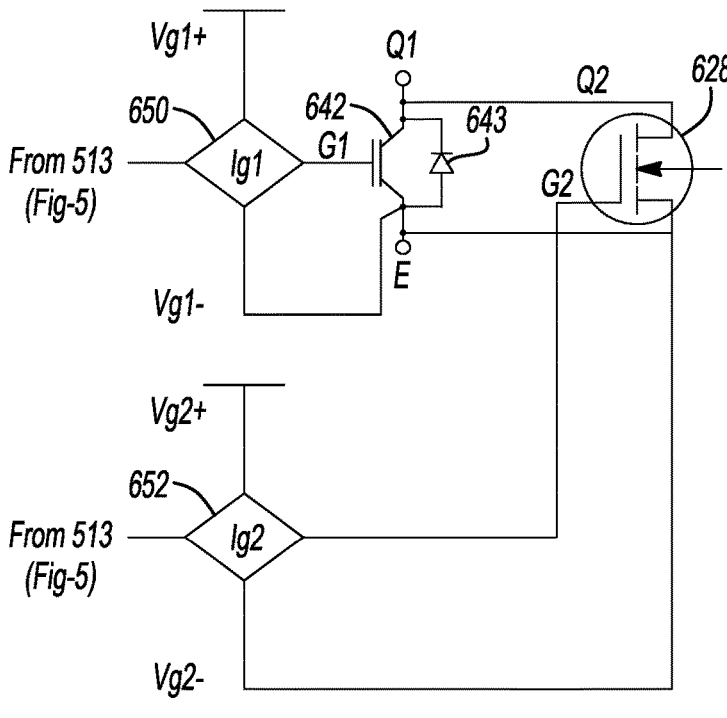
FIG. 6 is another embodiment of current sources of a VCGD for controlling the output gate current for each die of the hybrid switch.

FIG. 6 is another embodiment a VCGD for controlling the output gate current for each die of the hybrid switch. The features of FIG. 6 are similar to those of FIG. 5, with the main difference being the configuration of the current sources 650 and 652 in this embodiment as coupled to the outputs with gate driver 513. In this embodiment, the gate driver 513 is configured to control the output current Ig for each physical semiconductor die of the switch. A current source 650 is coupled to an output of gate driver 513, or a similar gate driver having two outputs. Current source 650 has an output coupled to the gate of the IGBT 642, a rail coupled to a first voltage supply (Vg1+) coupled to the current source 650, and a second voltage supply (Vg1−) coupled to an emitter E of the IGBT 642 for allowing the flow of current ig1 through the gate G1 of the IGBT 642. As before, a diode 643 is disposed between the collector C and emitter E of the IGBT. In this example, a current source 652 is also coupled to an output of the gate driver 513, or a similar gate driver having two outputs. The current source 652 is also coupled to a rail having a voltage of (vg2+), and to the emitter E voltage by virtue of the emitter E being coupled to the drain or other non-gate terminal of the MOSFET. The gate driver may have a single or multiple 650 and 652, each driving a single or multiple transistor die, switch, or hybrid power module.

With continued reference to FIG. 6, the collector is coupled to the drain Q2 of MOSFET 628, or a non-gate terminal of the MOSFET. Current source 652 is thereupon coupled to gate G2 of the power MOSFET. As in the embodiment of FIG. 5, the VCGD of FIG. 6 utilizes CSs to allow variable output or sinking currents to the gates of the individual switches, and in other embodiments, to their dies, or a combination of the hybrid PM. The configurations in FIGS. 5 and 6 allow the hybrid PM to control SR in or near real-time with precision. For example, unlike existing implementations where the SR is a single value during a single switching event (e.g., a switch-on or a switch-off), the VCGDs described above are configured to use different SR values for a single switching event that optimize loss, dV/dt, overshoot, and ringing that otherwise is left unaccounted for in the hybrid PM.

It should be noted that, in considering a transistor layout of the circuit described in FIG. 6, each die may have its own current source such that different dies may advantageously be controlled individually to accommodate different switching speeds. Similar to FIG. 5, the current sources 650 and 652 of FIG. 6 may include one, or a plurality of, transistors or other circuit elements. Further, additional current sources, or current source arrays, may in some cases be deployed.

The switching of a hybrid switch according to an exemplary embodiment is now described.

Figure 7A:
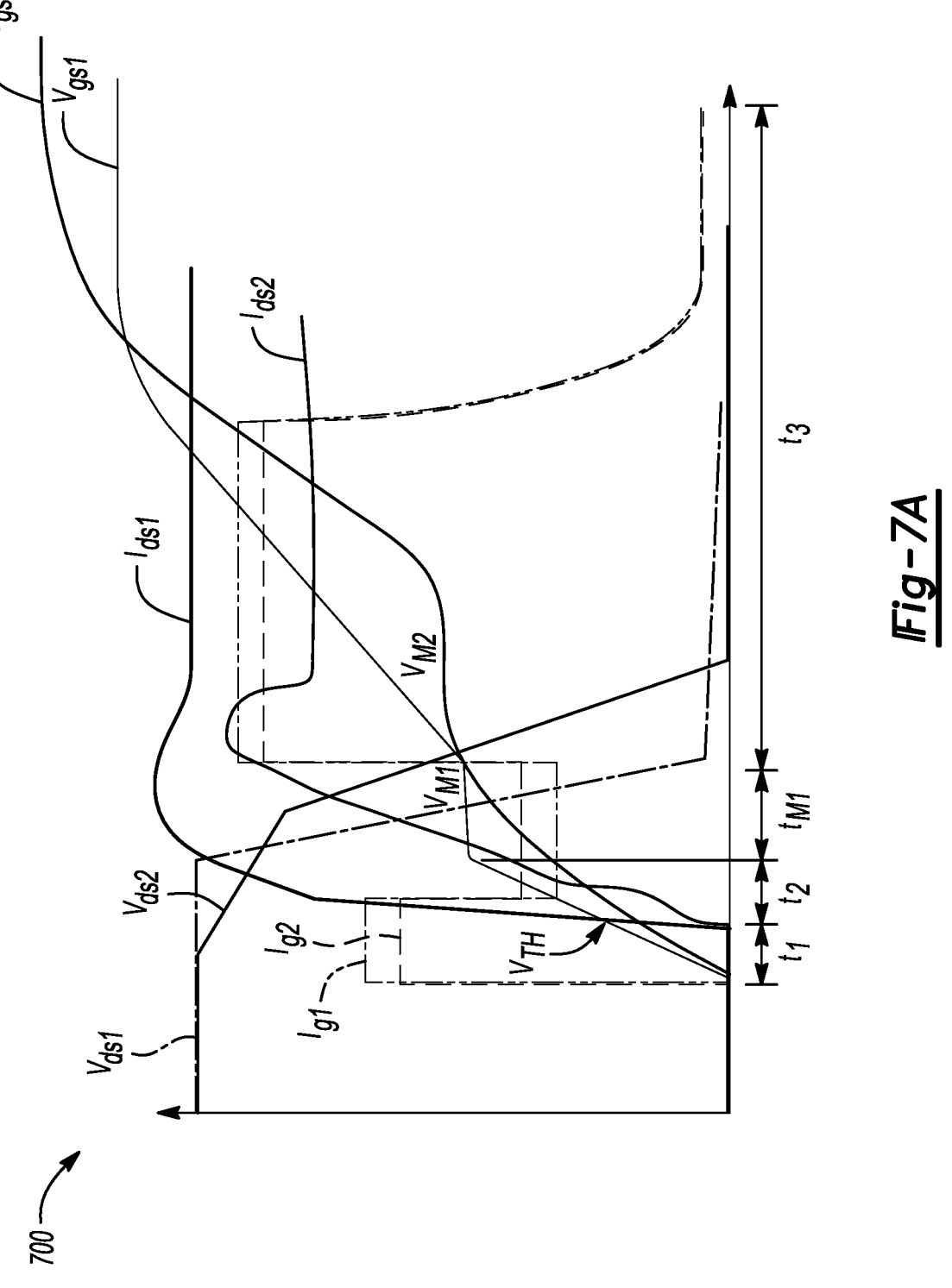
FIG. 7A is a timing diagram illustrating a series of waveforms present during a turning-on of a hybrid switch due to waveforms from a PWM generator and an output gate current of a hybrid switch in the PM and to regulate the switching speed, loss and overshoot.

FIG. 7A is a timing diagram 700 illustrating a series of waveforms present during a turning-on of a hybrid switch due to waveforms from a PWM generator and an output gate current of a hybrid switch in the PM and to regulate the switching speed, loss and overshoot. In FIG. 7A, two sets of waveforms are shown which correspond respectively to Ig1 and Ig2. In one embodiment, a first set of current sources may source and sink a gate current into/from a first power transistor (or group thereof) of one semiconductor type, and a second set of current sources may source and sink a gate current into/from a power transistor (or group thereof) of a different semiconductor type. In practice, however, different numbers of current sources may be used. More than two semiconductor technologies may also be used to implement a hybrid switch. As an example, three or more current sources (or sets of current sources) producing three or more distinct, bi-directional gate currents may be used in a power inverter module (PIM) to drive a polyphase motor. For clarity and to avoid unduly obscuring the concepts of the disclosure, two current sources are used.

Referring back to FIG. 5, it should be noted that the circuit elements in current source 520, 522, 524 and 526 may be characterized by one or more of the waveforms of FIG. 7A. With brief reference to FIG. 5 again, because the emitter (E) of the Si IGBT 542 is coupled directly to the source of SiC MOSFET 528, and because the collector (C) of the Si IGBT 542 is coupled directly to the drain of SiC MOSFET 528, the voltage across the Si IGBT 542 and the SiC MOSFET 528 of the hybrid switch represents a single quantity. That is to say, in the example case of a current source gate driver, the gate driver directly outputs a current (or receives a current), but the ultimate result is that the power transistors also experience a voltage. In an exemplary embodiment, a turning on of the switch is illustrated. During a first time period t1 in FIG. 7A, the MCU is configured to apply a high switching speed (e.g., FIG. 5) by applying a high gate current Ig1 in this example during time period t1 and slightly beyond time period t1 until the gate-to-source voltage reaches the threshold voltage Vth. Meanwhile, the Vgs1 value increases quickly, surpassing the threshold voltage Vth specific to the transistor and consequently, right after Vth is passed, the drain current through the transistor shoots up quickly. This high SR of the gate current accelerates the rise of Ids1 to reduce switching loss and deadtime, e.g. to minimize the losses that occur during the time period when the transistor is transitioning between fully-on and fully-off.

During a time period t2 slightly after t1, the gate current Ig1 is quickly dropped to an intermediate value to reduce the switching speed and the rate of change $dI/dt=dI_{DS}/dt=dI_{CE}/dt$ of the hybrid switch (note again that in the circuits of FIGS. 5 and 7A, the collector C and emitter E of the IGBT are coupled, respectively, to the drain and source of the MOSFET). During a time period of $t_{M1}$, slightly after t2 where the gate current Ig1 has been quickly dropped to the intermediate value, the switching speed and the rate of change $dV/dt=dV_{DS}/dt=dV_{CE}/dt$ of the hybrid switch is likewise reduced (note again that in the circuits of FIGS. 5 and 7, the collector C and emitter E of the IGBT are coupled, respectively, to the source and drain of the MOSFET). These criteria, in turn, reduce undesirable attributes including overshoot and ringing in the drain current and voltage of the MOSFET. It is noteworthy that the gate current Ig1 may be further modified to apply different switching speeds and with less or more time-period slots based on the gate current amplitude, the rate of change (dI/dt) of the gate or the drain-source current, and the rate of change of change (dV/dt) as identified in the example above.

During the time period $t_{M1}$, the slope of Vgs1 is also reduced to correspond to the Miller plateau $V_{M1}$. With the gate current at the intermediate value during the latter portion of time period $t_{M1}$, switching speeds are reduced, as noted, due to the lower values of Vgs1 and Ig1. Further optimizations are available to reduce deadtime, loss, and overshoots, in other examples, such as applying different switching speeds based on the amplitude of Ig, and the SRs of Ig1 and Vg1.

Beginning at approximately the third time period t3 and extending thereafter, a high to a maximum gate current Ig1 is applied until each value of Vgs reaches the nominal turn-on voltage for each different semiconductor power switch, respectively. It is noteworthy that, during the time period subsequent to time t3, different switching speeds may be optimized based on the amplitude of the gate current as well as the rates of change $dI/dt=I_{DS}/dc$ and dV/dt and with less or more time-period slots.

In FIG. 7A, the overall voltage drop of Vds1 may be 400 volts or more, depending on the application. Once the switch is turned on, the current flowing through the transistor increases to provide the needed power, e.g., AC power, to the hybrid switch.

FIG. 7A also demonstrates the flexibility of using the current sources/sinks described in FIGS. 5 and 6 to shape and optimize the waveforms in different ways. For example, in a different embodiment, the gate current Ig2 may be used in a manner similar to Ig1, but where the relative amplitudes of Ig2 are modified from that of Ig1, for example, to control one or more different power transistor (or sets thereof) or simply to optimize the switching voltages to maximize performance. Here, Ig2 is used in connection with the turning-on of a power transistor (which may be the same power transistor or a different one). In the case of an identical power transistor, the drain-to-source voltage Vds2 may be identical to Vds1 at first. However, during time period t2 in which the value of Ig2 is changed to an intermediate value, this may result in different circuit behavior, such as the slope of Ids2 decreasing, and Vds2 dropping at or about the beginning time period t2. When Ig2 is switched again just after the end of time period t2 to another intermediate value that is less than Ig1, Vds2 may begin to slope downward, albeit at a slower rate than Vds1. In addition, the slope of Ids2 may decrease as shown. Also, the overall decreases in gate current may cause the slope of Vgs2 to be lower, which in turn may delay the onset of the Miller plateau Vm2 that is evident after Vm1. After the t3 period, the value of Ids2 may remain with lower overshoot, and may settle at a lower equilibrium value due in part to the constant value of Ig2 being less than Ig1. Once the voltages and currents reach equilibrium, the value of Ig2, just like that of Ig1, may be restored to its own equilibrium value near zero until the next turn-off cycle occurs. In sum, the gate current for the same or different semiconductor technologies in a hybrid switch may be used to optimize the switching capabilities of each die or each power module such that the power transistor has a fast switching speed, but not so fast to produce undesirable second order effects that may damage the circuit or the PM bearings.

In should be underscored that the principles of the disclosure equally apply to the switching off of the hybrid switch. In addition, one or more gate currents may be used to optimize a PM or PIM. While two examples were shown, a different number of gate currents may be used to drive a different device. Three sets of gate currents (or some multiple of three), for example, may be hybrid switches that drive a three-phase motor.

Variable slew rates SR control to turn the switch off in an optimal manner is essentially a reverse process in the simplified embodiments of FIGS. 5 and 6. In an example that mirrors the circuit described above during a time the circuit is driving a hybrid switch in the ON state and is about to transition to the OFF-state, a plurality of input ports for receiving pulse-width-modulation (PWM) control signals may be transmitted from a processing system to optimally cause the transition of the hybrid switch to the OFF state. For example, during a first off-period in switching a hybrid switch from its ON-state to OFF-state, a high switching speed is applied by using a high gate current (in the opposite direction from turning ON the hybrid switch) to reduce delay in the total switching operation. During a second off-time between a transition from the first turn-off period and a second turn-off period, the circuit reduces the switching speed by decreasing IG to again reduce dV/dt, and overshoot and ringing phenomena. In various embodiments, the PWM controller may be set up for further optimizations, applying different switching speeds with less or more time-period slots based on the current amplitude, dI/dt, and dV/dt. These embodiments may vary depending on the criteria including the impedance values at various stages of the circuit, the efficiencies of the circuit elements, and the like. Thereupon, during a third period, the circuit may apply a high IG to accelerate the reduction of the switch resistance, and thereby minimize switching loss until Vgs is off.

Referring back to FIG. 5 and FIG. 7A, it becomes apparent that the gate driver 513 and the current sources 520 and 522, and 524 and 526 allow the switches to dump or sink different amplitudes of gate current (IG) into the larger transistor. The timing diagram of FIG. 7 represents a turn-on event for the hybrid switch. A turn-off event may be illustrated such that, for a generally symmetrical waveform, the signals of FIG. 7 may be reversed in time and then shaped similarly, with down waveforms going up and vice versa.

It should be noted that for purposes of this disclosure, describing a "high", a "higher", a "low, or a "lower" voltage at the terminals of a circuit element, or also reading a value of a current, resistance, etc. as "high" the magnitude of this value is usually determined with respect to the current and voltage ranges as defined by the connected circuit elements, or based on average voltage, current or resistance ranges. They also may depend on the DC power supply, in addition to the internal value of the threshold voltage of a transistor. Thus a "high" gate current may be that of some quantity consistent with the upper or higher ratings of the particular circuit elements. Applying a high voltage or current, or a low voltage or current, will be readily apparent to those in the art upon understanding the high and low values that are to be expected in a given circuit element for the application at issue. For instance, a high Vds may mean that the voltage across the non-gate terminals of the transistor is at or near its highest value corresponding to an off state of the switch, whereas a low Vds may mean the same Vds is at or near zero volts. The fomer case may involve a low Ids that is closer to zero in a specified region, and the latter may mean that the ids is travelling at or near its maximum value. Process corners, temperature variations, and rail-to-rail DC voltages may also be relevant in determining which voltages or currents or high, and which are low.

Figure 7B:
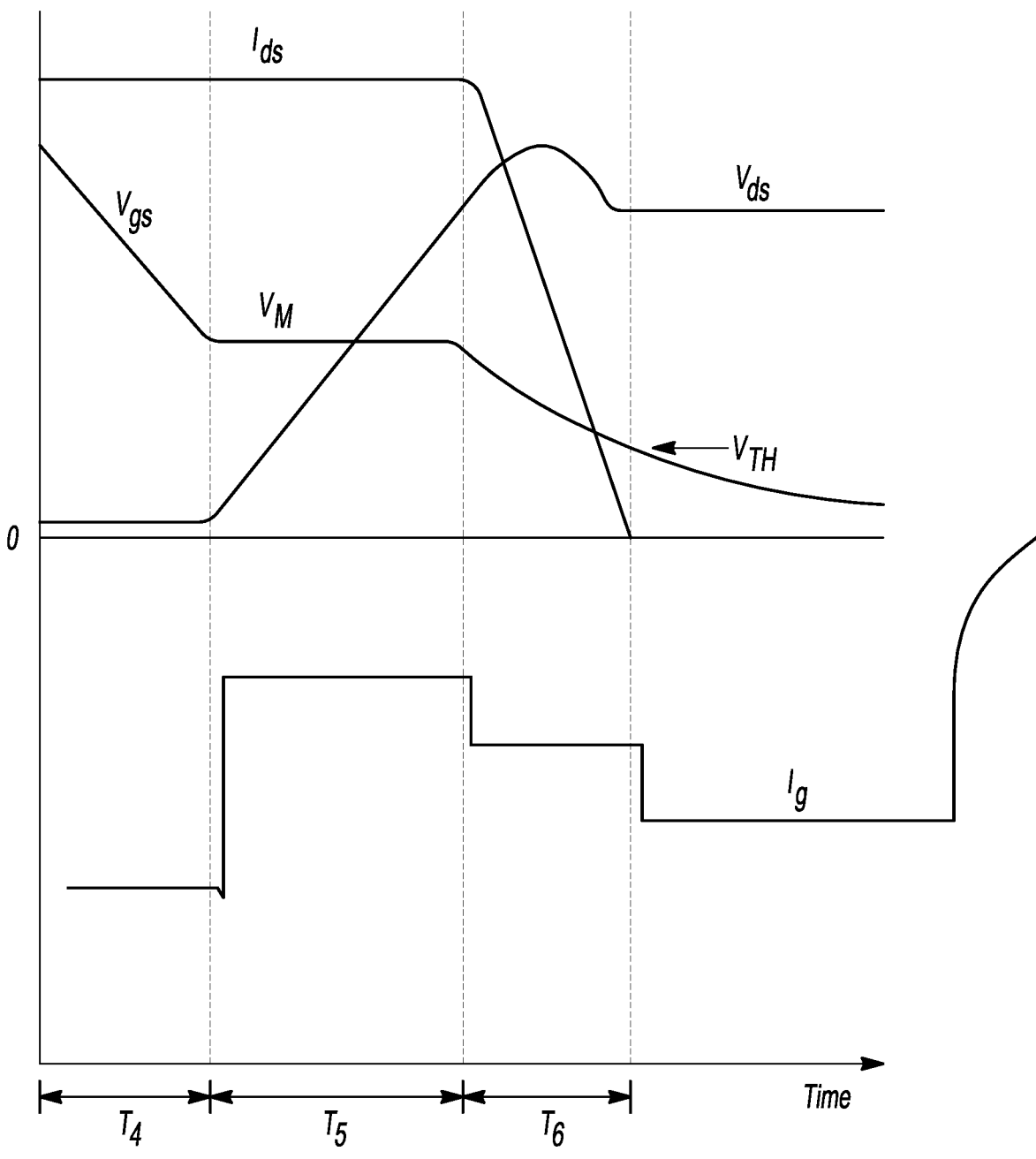
FIG. 7B is a timing diagram illustrating waveforms present during the turning-off of a hybrid switch due to a VCGD.

FIG. 7B is a timing diagram illustrating waveforms present during the turning-off of a hybrid switch due to a VCGD. The figure is similar to that of FIG. 7A but with the following exceptions. First, while FIG. 7A represents an example turning-on phase of a hybrid switch (such as a switch having one or more transistors with two different semiconductor technologies), in FIG. 7B, only one gate current is driven here for simplicity. In practical applications, such as driving an AC motor, several hybrid switches in a PIM may be used. Referring to FIG. 7B, the drain current Ids is shown at its maximum value during time period $T_4$, because the switch is open. Meanwhile during time period $T_4$, the gate current Ig is at a high (negative) value along with a rapidly decreasing value of Vgs during time period $T_4$ to reduce the delay and deadtime. The gate-to-source voltage progressively decreases until it reaches the Miller plateau, denoted here as the flat voltage $V_M$ during the time period $T_5$. Shortly after the beginning of time period T5, the magnitude of Ig is quickly reduced in value to its lowest of the three intermediate values. This action reduces the switching speed by lowering Vgs and Ig, thereby reducing dV/dt, and overshoot and ringing phenomena. Just as with the turning-on phase of FIG. 7A, the waveforms may further be optimized using different switching speeds based on the amplitude of Ig, and the slew rates dI/dt and dV/dt. Meanwhile, at the end of time period T5, the Miller plateau ends and, during time period 6, the magnitude of Ig increases, and Vgs returns to decreasing at a higher SR, but at a lesser SR than that of time period $T_4$ due to the lesser magnitude of Ig in time period T6, thereby reducing dI/dt. Meanwhile, as Vgs crosses the threshold voltage Vth, the transistor turns off and the drain current goes to zero Amps at the end of time period 6. After time period T6, a higher value of negative gate current Ig is applied and maintained to accelerate $dV_D/dt$ and $dV_{GS}/dt$, which, in turn, minimizes the switching loss until Vgs turns off. After the transistor is off and Vds reaches its upper equilibrium value, the gate current is quickly decreased in negative magnitude back to zero, and the values of Vos are maintained at the nominal turn-off voltages for the different semiconductor power switches, respectively.

FIG. 8A is a timing diagram illustrating the voltages and currents in switching ON a hybrid switch, with and without using dynamic slew change (DSC). The horizontal axis 801 is in units of time. The vertical axis 802 is in units of amplitude, i.e., voltage for V-labeled waveforms and amperes (amps) for I-labeled waveforms. FIG. 8A, as noted, depicts turning on of the switch. Referring initially to scenario 1 (without slew control), the gate driver integrated circuit turns on the transistors by switching the gate-to-source voltages to values that exceed the threshold voltage sufficient to allow the current $I_{DS1}$ to reach a maximum value. It is noteworthy that high frequency components such as ringing and EMI are omitted for the purposes of simplifying the presentation, at least because they are unlikely to have a material effect on the results that are the focus of this material. As the current $I_{DS1}$ increases in response in a manner proportional to that of the SR of the gate-source voltage, the voltage across the drain and source ($V_{DS1}$) eventually decreases from its fixed value to a value close to zero (because the transistors are not ideal switches). The rate of change of $I_{DS1}$ is high. Both overshoot and high values of SR (e.g., dV/dt, dI/dt) contribute to (i) higher electrical stress on power switches, leading to physical damage, (ii) higher ringing, and higher conductive and radiated EMI, and (iii) higher motor terminal voltage overshoot (partial charge inception voltage or PDIV) and bearing current, each of which may lead to various types of damage. The overshoot of $I_{DS1}$ above its steady-state value at 802 is apparent. Because $I_{DS1}$ extends above its nominal maximum value and continues to increase during the overshoot, the switch is still experiencing losses. Meanwhile, as the gate-source voltage (omitted) continues to increase at a fixed slew rate. To estimate the additional switching loss caused by the overshoot, a line 806 is drawn tangential to the apex of overshoot of $I_{DS1}$. The hypothetical line 806, which begins at the apex of the overshoot of $I_{DS1}$ and continues downward until it reaches $V_{DS1}$, represents the approximate area under the curve under $I_{DS1}$ between when $I_{DS}$ begins at 0 and $V_{DS1}$ ends at 0 and including the apex from the overshoot, which is the estimated total switching loss ("Loss$_1$") by virtue of being limited to a single SR.

Referring again to FIG. 8A, but this time employing an example VCGD using a dynamic slew rate, the switching speed is initially applied such that the current $I_{DS2}$ through the transistor is accelerated at the region 809 adjacent the $I_{DS2}$ waveform, producing a steep slope. However, with DSC applied, the switching speed is reduced by reducing $I_G$ (omitted for clarity) beginning about when the drain current overshoots the nominal maximum value of $I_{DS2}$ (at about line 804) or the $V_{DS}$ starts to reduce. As noted above, the reduced switching speed caused by the lower gate-source current values reduces the SR of $V_{DS2}$ (e.g., $dV_{DS2}$/dt). This SR reduction in $V_{DS2}$, which was not present in $V_{DS1}$, means that the slope of $V_{DS2}$ as it returns to a nominal value close to 0 is smaller than the corresponding slope of $V_{DS1}$ as it returns to approximately zero. That is to say, $dV_{DS2}$/dt<$dV_{DS1}$/dt. Thus, using the VCGD with the same hybrid switch results in reduced ringing, a decreased time in overshoot, and common mode and bearing currents.

To estimate the additional switching loss caused by the overshoot, a line 818 is drawn to extent to the apex of overshoot of $I_{DS1}$. The hypothetical line 806, which begins at the apex of the overshoot of $I_{DS1}$ and continues downward until it reaches $V_{DS1}$, represents the approximate area under the curve between $V_{DS1}$=0 and $V_{DS1}$ ending at zero, and including the apex, which is the estimated conduction loss ("Loss$_2$") by virtue of using a VCGD. From the graph it is evident that Loss$_2$<Loss$_1$, which in turn means that overall higher performance with fewer switching losses may be achieved using the principles of the present disclosure.

FIG. 8B is a timing diagram that is similar conceptually to FIG. 8A, but that instead illustrates the voltages and currents in switching OFF of a hybrid switch, with and without using dynamic slew change (DSC). Referring initially to the case where a single SR is available and the transistor is in an "on" position, a driver may reduce Vos which results in $V_{DS1}$ across the transistor increasing. This causes the voltage $V_{DS1}$ to rise back from zero to its overshoot peak, prior to finally equalizing at its nominal value. As Vos nears the threshold voltage, $I_{DS1}$ proceeds to decrease at a fast rate until the gate threshold is crossed and a drain current value of zero is reached. Referring next to the second case where a VCGD is used, and applying a similar analysis as in FIG. 8A, the result is analogous; the use of a modified SR creates less overshoot, ringing, and DMI, and a lower overall switching loss.

One issue that has been encountered with respect to certain semiconductor technologies is the difference in sizes and/or compositions of the transistors. More generally, one of the two or more switches in a hybrid switch may have a much smaller input capacitance than the others, leading to a much faster ON state for the device with the small capacitance. Using the example where the hybrid switch includes a SiC MOSFET and a Si IGBT, the former device is much smaller than that of the latter device. The much smaller gate of the SiC MOSFET relative to that of the Si IGBT means that the SiC MOSFET has a much smaller input capacitance. This discrepancy results in a much faster turning ON of the SiC MOSFET than the Si IGBT, resulting in overcurrent and other potentially-harmful electrical artifacts.

Accordingly, in another aspect of the disclosure, the VCGD (FIGS. 5 and 6) is configured to increase the turning-on speed of the IGBT and to optimize ZVS by controlling the output gate current, and to optimize the turning on of the hybrid switch with or without using PWM delay control (e.g., delay PWM signals to faster semiconductor to help equalize switching on or off timings).

These actions may be summed more compactly as follows:

Optimize the IGBT's loss, overshoot, and dI/dt using dynamic gate current control while speeding up the switching of the IGBT Optionally reduce slew rate of SiC MOSFET to comport with that of Si IGBT, which increases loss ZVS is a technique involving switching a semiconductor on or off with minimal switching stresses. Using ZVS, when a MOSFET is switched from one state to another, the controller or MCU waits until the driving voltage drops to zero before the MOSFET is switched. ZVS is the concept that, because Power=voltage×current, when the voltage is kept at ground, no power loss is experienced regardless of the value of the current. ZVS may apply in the context of silicon or wide-bandgap (WBG)-based semiconductors. WBG semiconductors have a larger bandgap than conventional semiconductors. The bandgap is the energy difference in a semiconductor between the top of the valence band and the bottom of the conduction band. This larger energy difference permits WBG-based power transistors to operate at higher voltages using higher frequencies. Examples of WBG semiconductors include gallium nitride (GaN) and silicon carbide (SiC). WBG semiconductors in power-based applications include increased efficiency and power density without added system costs. Caution should be taken, however, because excessive values of dV/dt may induce a high voltage across the rotor/stator insulation. Accordingly, its value should be controlled so as not to damage structures in the motor. At the same time, however, it is beneficial to increase the initial switching speed with as fast an adjustment current as is practical to maximize the power transferred to the motor. This stems from the relationship power (P)=VI. Because current is proportional to the area through which the moving charge passes, a tradeoff is present in that one limiting factor to the maximum delivered power is the maximum size of the semiconductor transistors. Sophisticated control of switching speed enabled by the VCGD may enable ZVS while mitigating the tradeoffs.

PWM delay control may also beneficially be used to delay the update of PWM outputs to the faster transistor. This enables the slower transistor to initiate its turning-on earlier. To this end, reference is made back to FIG. 4b, which include respective timing diagrams of the switching waveform of a silicon insulated-gate bipolar transistor (Si IGBT) pulse 430a and that of a silicon-carbide metal oxide semiconductor field effect transistor (SiC MOSFET) pulse 430b. As noted above, the VCGD in cooperation with the MCU 506 (FIG. 5) may employ dynamic gate current manipulation with PWM delays t1 and t2 as needed to correct for these differences in input capacitance.

Another problem that has arisen is the fact that the WBG (typically the smaller die) may be packaged with the IGBT which is larger would cause a non-optimal loop size for the WBG device and that causes the concerns of larger commutation loop specifically for the WBG device. To counter this phenomenon, in accordance with yet another aspect of the disclosure, the VCGD may increase the turning on and turning off speeds of the slower power transistor or reduce the turning on and turning off speeds of the faster transistor. The VCGD may accomplish these objectives by controlling its output gate current to the faster transistor and optimizing it using the PWM delay. These actions beneficially may optimize the IGBT's overshoot, ringing, dV/t and dI/dt using the dynamic gate current control while also increasing the speed of the switching. In an optional embodiment, the VCGD may reduce the slew rate of the SiC gate, although doing so increases the switching loss.

Yet another problem with some gate drive hardware is the perceptibility of the Miller effect, in this example that of the Si IGBT. To this end, there exists a region in which the gate-to-source voltage reaches the gate-plateau voltage $V_{GP}$, also known as the Miller voltage. This voltage, which describes a region of the semiconductor, comports with the OFF region. During this so-called second turn-off time, $V_{GP}$ will have a zero or near zero slope. In some gate drivers, the Miller effect of one of the semiconductors (e.g., Si IGBT) becomes noticeable. For example, the SiC's high dV/dt will induce the Miller current to the Si IGBT and potentially result in a false turn on of the transistor, resulting in an IGBT tail current or short circuit. The use of PWM control, by itself, cannot provide a full ZVS to correct this problem, resulting in increased conduction losses, or short circuit device damage.

Accordingly, in another aspect of the disclosure, the VCGD may lower the gate current $I_G$ to the SiC during the dV/dt stage of the turning-off process to reduce the Miller current into the IGBT. Benefits of this dynamic gate current control include optimizing the loss increment, enabling the saving of the Miller clamp circuit, and enabling reduction of the negative voltage, the latter of which results in savings of switching loss.

In a further aspect of the disclosure, the VCGD may be configured to control SRs to optimize reverse recovery current. It is noteworthy that, to the extent the MCU, processor or processing system in each aspect of this disclosure includes hardware functionality or code that may participate in directing the VCGD to perform its stated objective, the VDGD for purposes of this disclosure includes that hardware functionality of, or code executing within, the MCU, processor, or processing system.

Reverse recovery current in a power transistor results from the movement of reverse charge carriers. For example, when a MOSFET is switched OFF, the forward current decreases, and remaining charges flow in reverse over the body. Reverse recovery current thus includes the dissipated power of a switching transistor, which becomes increasingly pronounced with increasing switching speeds and power. Since P=V×I, faster switching speeds indicate that the relative amount of power dissipated in the reverse direction also increases. Due in part to its device structure and semiconductor characteristics of the IGBT over the MOSFET, the IGBT has a much higher reverse recovery current, causing overshoots, EMI, and ringing. Due to higher parasitic inductance of the IGBT cover the MOSFET, the inductive voltage drop [ΔV=L×(dI/dt)] is increased, resulting in delayed reverse recovery current peaks and additional voltage drops at the IGBT, resulting in increased switching losses.

To address this shortcoming, the VCGD may be configured to control dI/dt to reduce reverse recovery, improving overshoot, and enabling higher switching speeds. For example, in various embodiments, the VCGD is configured to reduce the gate current to the SiC (i.e., on the low side, 409) gate during the dI/dt stage of the turning on phase to reduce the reverse recovery current from the IGBT of the other side (i.e., the high side, 411, 415 and D3). Reducing the reverse recovery voltage ($V_{RR}$) optimizes the loss increment, thereby enabling higher switching speeds. In addition, reducing $V_{RR}$ enables the ability to use a Miller clamp circuit in some embodiments, or not have them in others as is suitable for the design. The reduced $V_{RR}$ also may reduce the negative voltage, the latter of which reduces switching loss.

FIG. 9 is an example hybrid switch showing the various parasitic inductances of different dies in the power module due to differences in die sizes and loop sizes, resulting in discrepancies in voltage overshoot and ringing. For example, because ΔV=L×(dI/dt), different voltage drops may occur due to these different values of inductance, resulting in switching losses that may be addressed according the disclosure. Accordingly, in a further aspect of the disclosure, the systems and circuits herein may be used to control SRs in a manner that optimizes reverse recovery current. In one exemplary embodiment, the IGBT has a much higher reverse recovery current, which as noted results in overshoots, ringing and EMI phenomena. FIG. 9 shows an example of an upper hysteresis module with high terminal $E_H$, a power MOSFET having gate terminal $G_{MOSH}$, two IGBTs 910 and 912 coupled to gate terminal $G_{IGBTH}$, diode D1 between the gate and source terminals of the MOSFET and, for each of the power terminal DC+, and the remaining terminals $G_{MOSH}$, $G_{IGBTH}$, and $E_H$ into the respective source and emitters of the IGBTs 910 and 912. For each of these terminals, and more specifically for each individual conductor that is coupled directly to the gates, source, drain, collect and emitter terminals, a parasitic inductance is associated. These include terminals 902, 908, 918, 920, 904, 910, 912 and 922. The upper hysteresis circuit is modeled with a parasitic inductor 906 coupled with diode D2. Diode D2 in turn is coupled to a neutral terminal which connects via parasitic inductor 924 and a matching diode to the negative DC terminal (DC−). A lower hysteresis module similar to the upper module is also included, with parasitic inductance values at each of the terminals discussed above, including the $G_{MOSL}$ and $G_{IGBL}$ terminals mirroring the above gate terminals, a low $E_L$ terminal mirroring the high terminal $E_H$, and an identical set of transistors, diodes and parasitic inductances at each of the terminal conductors. That is parasitic inductances 926 and 934 exist at the non-gate terminals of the IGBT parallel pair 914, inductances 930 and 932 into the respective MOSFET and IGBT gate terminals, and parasitic inductances 928 and 936 at the non-gate terminal of MOSFET 916. The $E_L$ terminal is coupled to inductances 934 and 936 and to the DC-terminal A neutral terminal is coupled to D2 and inductor 924.

Each of the above inductances is typically unique, with the gate inductances of the IGBTs typically dominating. Accordingly, in an embodiment, the VCGD may reduce the gate current to the SiC MOSFET during the dI/dt stage of the turning-on of the device to reduce the reverse recovery current from the IGBT. In another embodiment, the VCGD may reduce the gate current to the power switches of one hysteresis circuit during the dI/dt stage of the turning-on of the device to reduce the reverse recovery current of the power switches of the other hysteresis circuit. As noted, the loss increment may consequently be optimized, enabling higher switching speeds by reducing the reverse-recovery voltage $V_{RR}$. The reduced gate current also assists in saving the Miller clamp circuit and allows for a reduction of the negative voltage, the latter for reducing switching losses. An improved overshoot may be achieved with a higher switching speed. With reference to FIG. 9, the sum of the high-side and low-side currents, $I_{FH}$ and $I_{FL}$, is the constant output current. With the constant output current, the respective high-side and low-side currents' SRs are equal in magnitude and opposite in direction; that is to say: $dI_{FH}/dt=-I_{FL}/dt$.

A further aspect of the disclosure allows the VCGD to control SRs for the purpose of reducing dead time. Another potential shortcoming of the hybrid switch shown in the various figures is that one type of semiconductor may need a larger switching delay time than the other in a hybrid power switch. For example, in the case of the IGBT/MOSFET hybrid switch, the IGBT needs a much larger switching delay time, which increases dead time and its associated losses. For example, the IGBT voltage pulse across the collector and emitter will take a longer time to turn on than the MOSFET (whose non-gate terminals are connected respectively to the non-gate terminals of the power MOSFET) and also a longer time to turn off than the MOSFET. These delays and their resulting losses may be resolved by the VCGD increasing the gate current into or out of the IGBT at both the turning on and turning off periods to shorten the switching delay time. The ratio of increased current through the IGBT versus the current through the MOSFET may be calculated in advance using the properties of the respective transistors, the circuit, and the power module parasitics in FIG. 10 in which the transistors are operating. The result is reduced dead time, reduced inverter loss, and improved efficiency of the motor being driven by the PM with the hybrid switches.

In still another aspect of the disclosure, the VCGD may be configured to balance the switching speeds of the two or more transistors of the hybrid switch to optimize current sharing. The problem originates from the fact that semiconductor dies of different technologies, different parasitic inductances of the dies in the power module (FIG. 9), or different part-to-part variation from die to die (i.e., Vth), switch at different speeds. Faster switching dies generate risks of overcurrent and worse, thermal runaway. Thermal runaway is a self-reinforcing phenomenon wherein increased collector current (e.g., in an IGBT) increases temperature. The increased temperature, in turn, causes further increased collector current, which again increases the temperature, thereby further increasing the current, and so on. Destruction of the transistor may result. As another example, a test run in a laboratory may indicate that as currently configured, a particular semiconductor manufacturer's specification may indicate that a 50-Ampere rated SiC MOSFET may support an instantaneous current of 294 Amps. The specification may indicate, however, that the same MOSFET transistor may not support three-hundred Amp operation for 500 ns. Accordingly, the VCGD should modify the slew rates to reduce either the amplitude or the duration of the peak current through the MOSFET, or both. When these SR adjustments are optimized for the hybrid switch including the MOSFET(s) and other transistor(s), the other harmful phenomena may be reduced for the other transistor(s) in the hybrid switch as well.

In various aspects, the VCGD may be configured to address this issue up front by balancing the relative switching speeds of the SiC and IGBT in this example or different dies in a power module in a manner that optimizes current sharing between the devices while also controlling the overshoot, switching losses, and voltage and current-based SRs. An optimal sharing of current not only may balance the switching speeds in the hybrid switch, but also may reduce the above-described thermal stress, improve device reliability, and prolong transistor life, while increasing output current capability. To accomplish these objectives, the VCGD may employ SR control in a manner that (1) maintains different types of semiconductors within their safe operating areas (while taking cost into consideration), (2) achieves current balance for different ratios of WBG and non-WBG semiconductors, and (3) mitigates degradation caused by overshoot and mismatch. Referring back to FIG. 2, the overshoot of the voltage Vds and current Ids may be reduced using current sharing, thereby enabling the overshoot and ringing phenomena to be reduced to values that are within stated specifications.

Another aspect of the disclosure may provide top-level control for hybrid switches. Taking the example of an electric vehicle (EV), the EV operates under various operating conditions, including, for example, speed, load, junction temperature, and others. That same EV may have a variety of functions to accommodate one or more of these operating conditions. They may include a maximum power mode, a heat or energy recovery function, and a transistor safe turn-off function when a short circuit occurs, among many other potential types and categories of functions. In an embodiment, the VCGD may be configured to perform one or more of the above-referenced functions to automatedly categorize different slew rates for the hybrid switch, optimal for different EV operating conditions. For example, the vehicle may maintain a set of different slew rates that may be organized using various factors. Examples of these factors include the "revolutions per minute" or equivalent value of the motor, the standard operating conditions, the power transistor current ratings, the instantaneous or maximum torque of the EV, the operating power, and various degradations of different parameters. In addition, actual or rated power, city versus highway driving may be used by the MCU or processor in determining the SR amongst a number of different SRs that correspond to different sets of categories. In these cases, the number of the SR closest to the criteria deemed relevant by the processor may be employed, and the SRs in the hybrid switches may be modified in accordance with the rules and criteria set forth in memory for the problem(s) at issue. In additional embodiments, one or more of the SR categories may include "real time" functionality in which different SR values are also modified based on current conditions in the automobile. In other embodiments, the various conditions may first each be elicited before selecting the SR category, after which the SR category may perform its mitigating actions, while the hybrid switch currents, voltages and other parameters are tested in real time to verify performance improvement. In sum, an SR category may include, for a given set of EV operating conditions and functions, the concurrent reduction in switching losses, bearing currents, voltage overshoot, ringing, and EMI.

It should be noted that, while the micro-controller unit (MCU) may be the MCU integrated into a dedicated ECU or network thereof, for purposes of this disclosure, the terms "MCU" and "processor" may constitute more than one processor. The terms may refer to each kind of controller or microcontroller for executing various tasks enumerated in this disclosure, including the analysis and modification of SRs, current sharing, reduction in dead. In some cases, at least part of the processor may include dedicated hardware, such as in a digital signal processor (DSP). The processor may also be implemented (in part or in full) with an application specific integrated circuit (ASIC), a System on a Chip (SoC), combinational Boolean logic circuits that perform the requisite digital functions, a field-programmable gate array (FPGA) Application Specific Integrated Circuits (ASICs), or another type of programmable logic device (PLD). The transistors used in the processor may include complementary metal-oxide-semiconductor (CMOS) technology, bipolar junction transistors, Gallium-Arsenide transistors, or some combination thereof. The processor may execute middleware, and in some embodiments, it may rely at least partially on one or more application programming interfaces to communicate with other systems. The processor may also include upgradeable firmware. The memory may be logically partitioned to include a database or repository, or relational or non-relational data tables.

The processing system may include memory (e.g., various levels of cache memory, dynamic random access memory (DRAM), static random access memory (SRAM), programmable read only memory (PROM), electrically-erasable programmable read-only memory (EEPROM or EPROM), flash memory, magneto-based hard drives, solid state hard drives, and the like. The memories may include code stored therein and data. The collective structural and functional architecture of the processing system is intended to simplify the parlance and to acknowledge that the code may be executed using processors at separate locations, for example or in several diverse ways, just a few of which are described above.

In still another aspect of the disclosure, hybrid switch control may be employed based on motor or PIM current feedback. In a first relevant embodiment, the VCGD may be configured to adjust the ratio of usage of non-WBG switches over WBG switches based on real-time feedback of the motor or inverter current. For high currents, the VCGD may be configured to favor the non-WBG device to carry the current. For low currents, by contrast, the VCGD may be configured to equalize the ratio using a WBG device. Medium currents may entail adjustment of both semiconductor types and depend on the circuit configuration. In a second relevant embodiment, the VCGD may be configured to control SRs based on the non-WBG/WBG ratio, the current, the motor and PIM/inverter temperatures, the switching frequency, and the PWM strategy, among other features and aspects.

The above-referenced embodiments may beneficially utilize SiC of the hybrid switch, if available, to switch faster for low and medium currents. This enables the IGBT to cool down during the SiC switching and carrying the current at low and medium values of current. Further, the SiC may cool down during the IGBT operation. These cooling periods enable faster switching frequency for both SiC and IGBT semiconductor elements. Cooler operation, in turn, reduces the hybrid switches' on resistance ($R_{DS}ON$) across the transistors, increasing inverter efficiency. Faster switching frequency also enables high motor efficiency, as it is understood that the motor losses are typically greater than the inverter losses. In addition, these embodiments optimize switching speed versus bearing current; that is, to provide ratios and SRs that allow for a fast switching speed and therefore a fast motor, while ensuring that the switching speed is not high enough to damage the bearings due to the parasitic bearing current. It should be noted that in general, a conventional switch uses the same switching frequency for each current. The SiC provides for a faster switching speed up to a medium current.

To summarize various of the embodiments and benefits of the principles of the present disclosure, the gate driver may utilize current sources (CS) to provide or sink variable output currents to or out of the gates of the individual switches, dies or their combination, of the hybrid PM or individual die of a uni-PM to precisely control their switching SRs in real-time. In another embodiment, an isolated apparatus based on a variable current source is configured to change the SR between and within a switching event to optimize the performance of the hybrid PM. That is to say, for purposes of this disclosure, the VCGD may be construed to include the current sources as part of the VCGD, or they may be construed as being coupled with the current sources. In still another embodiment, SR control is used to compensate capacitance differences of the fast and slow switches of the hybrid PM with and without the PWM delay control. SR control may also be used by the VCGD to compensate for parasitic inductance differences between the fast and slow switches of the hybrid PM with and without the PWM delay control.

SR control as described above may further be employed to reduce the reverse recovery current of the Si switches or diodes of the hybrid PM with and without the PWM delay control. SR control may also be used to reduce dead time of hybrid PM with and without the PWM delay control to reduce inverter and motor loss. Similarly, SR control may be used to reduce the Miller current of the hybrid PM with and without the PWM delay control to reduce the loss. In another embodiment, SR control may be used to mitigate the current-sharing imbalance of different switches in the hybrid PM with and without the PWM delay control. It should be underscored that these new apparatuses and methods are applicable for both voltage-source and current-source based GDs or hybrid GDs, as detailed above in FIGS. 5-8 and the accompanying text.

In another embodiment, the VCGD may implement feed-forward control using look up tables (LUTs) in a memory or accessible from a network location to alter SRs based upon operating conditions, e.g., DC voltage, current, Vth, $R_{DS}ON$, junction temperatures, motor temperature, coolant temperature, inverter temperature, parasitic inductances, transistor signal sensing, and part-to-part variation and degradation, transistor on-resistance (Ron), and gate current sources for these conditions. The gate driver may in other embodiments include galvanic isolation integrated therein, or galvanic isolation may be implemented in a separate part.

Slew rate control may further be employed for capacitor discharge(s), for limiting current and voltage (I/V) overshoots, and for controlling the temperature, current, and voltage of the switch, capacitor and battery such that they are maintained within safe operating limits. SR control may also be implemented for multi-level turn-off to reduce soft turn-off time and device voltage overshoot when the switch is in short circuit. In still other embodiments, a diode may be added in an active Miller clamp circuit to protect the transistor gate from the Miller currents of the other transistors.

In other embodiments, the ratio of Non-WBG switch over WBG switch may be determined based on real-time feedback of motor/inverter current to reduce temperatures and switching losses. The VCGD may further control SRs based on the Non-WBG/WBG ratio, current, DC voltage, motor and inverter temperatures, switching frequency, PWM strategy, etc. Additionally, a controlled deadtime based on Vth measurement may be undertaken to take account of part-to-part variation and degradation.

It should also be noted that terminology in the claims similar to "current sources controlled by the PWM signals," "current sources controlled by the PWM outputs," "output stage of transistors controlled by PWM signals" and similar language, unless specifically defined otherwise, neither necessitates nor prohibits a direct connection between the current sources and the PWM outputs. For example, in some embodiments, the control may be intermediate and transistor circuits may lie between the output PWM signals and the current sources. Passive circuit elements, digital circuits (e.g., decoders), and other structures may exist between the PWM output and the current sources.

The detailed description and the drawings or figures are supportive and descriptive of the present teachings, but the scope of the present teachings is defined solely by the claims. While some of the best modes and other embodiments for carrying out the present teachings have been described in detail, various alternative designs and embodiments exist for practicing the present teachings defined in the appended claims. Moreover, this disclosure expressly includes combinations and sub-combinations of the elements and features presented herein.

What is claimed is:

1. A variable-current gate driver (VCGD) for providing slew rate (SR) control of a power module (PM), comprising:
   a gate driver including a plurality of input ports for receiving pulse-width-modulation (PWM) control signals transmitted from a processing system and a plurality of outputs; and
   a plurality of current sources controlled by the PWM signals and coupled to a corresponding one of the plurality of outputs on the gate driver with the plurality of outputs coupled to respective gates of at least two transistors of a hybrid switch in the PM, the at least two transistors comprising different semiconductor technologies, at least one of the current sources is respectively coupled to at least one other non-gate terminal on each of the at least two transistors,
   wherein the plurality of current sources are configured to provide the SR control of the PM using variable gate current values to thereby compensate for the different semiconductor technologies in real time to reduce switching losses and improve PM efficiency.

2. The variable-current gate driver of claim 1, wherein the current sources are configured to adjust variable gate current values of the hybrid switch to provide the SR control of the at least two transistors for one or more of: changing respective switching speeds; compensating for different input capacitances; compensating for differences in parasitic values; reducing a Miller current; optimizing a reverse recovery current; reducing transistor dead time, optimizing current sharing between the at least two transistors, or providing top-level control of the hybrid switch.

3. The variable-current gate driver of claim 1, wherein the gate driver comprises an integrated apparatus physically separate from the processing system and the PM.

4. The variable-current gate driver of claim 1, wherein the SR control is configured to compensate for capacitance differences between the at least two transistors of the hybrid switch, either with or without using PWM delay control.

5. The variable-current gate driver of claim 1, wherein the SR control is configured to compensate for parasitic inductances between the at least two transistors of the hybrid switch, either with or without using PWM delay control.

6. The variable-current gate driver of claim 1, wherein the SR control is configured to reduce reverse recovery current between the at least two transistors of the hybrid switch or between a diode coupled between non-gate terminals of one of the at least two transistors.

7. The variable-current gate driver of claim 1, wherein the SR control is configured to reduce a dead time of the PM either with or without using PWM delay control, to thereby reduce losses in an inverter within the PM or a motor coupled to the PM.

8. The variable-current gate driver of claim 1, wherein the SR control is configured to reduce a Miller current corresponding to the hybrid switch either with or without using PWM delay control.

9. The variable-current gate driver of claim 1, wherein the SR control is configured to mitigate a current-sharing imbalance between the at least two transistors of the hybrid switch either with or without using PWM delay control.

10. The variable-current gate driver of claim 1, wherein:
    the PM includes an inverter module, the inverter module operable to drive a motor;
    one of the at least two transistors of the hybrid switch comprises a wide bandgap (WBG) semiconductor and another of the at least two transistors comprises a non-WBG transistor; and
    the SR control is configured to use feedforward control with look-up tables (LUTs) to alter a SR of the hybrid switch based upon operating conditions.

11. The variable-current gate driver of claim 10, wherein the operating conditions include one or more of a drain-to-source voltage ($V_{DS}$), a drain-to-collector voltage ($V_{DC}$), transistor threshold voltage VTH, transistor on-resistance ($R_{DS}ON$), motor phase current, junction temperature, motor temperature, circuit temperature, or a value of one or more gate current sources with the operating conditions.

12. The variable-current gate driver of claim 10, being galvanically isolated from the processing system and the PM.

13. The variable-current gate driver of claim 1, wherein a turn-on procedure of the hybrid switch comprises:
    a first time period in which at least one power transistor in an off-state has a steady positive value across non-gate terminals thereof, the steady positive value corresponding to an off-state, wherein at or near the end of the first time period, one or more of the current sources are configured to apply a high gate current rated for the at least one power transistor at a high switching speed, reducing deadtime and switching delay;

a second time period during which the one or more of the current sources are configured to reduce a switching speed of the at least one power transistor by applying a lower, non-zero current to the respective gates of the hybrid switch to reduce dV/dt, overshoot, and ringing, while increasing switching speed;

a third time period during which one or more of the current sources are configured to reduce a value of the respective gate currents to reduce dI/dt, overshoot, and ringing; and a fourth time period during which the one or more of the current sources are configured to increase a value of the respective gate currents to a high or near maximum value to minimize an on-resistance across the at least one power transistor and to minimize conduction losses.

14. The variable-current gate driver of claim 1, wherein the plurality of current sources include a first pair of current sources coupled to a first of the at least two transistors of the hybrid switch and a second pair of current sources coupled to a second transistor of the at least two transistors of the hybrid switch.

15. A vehicle, comprising:

a frame defining a body and a passenger cabin;

a processing system coupled to a variable-current gate driver within the body and configured to send pulse width modulation (PWM) signals to the variable-current gate driver;

a plurality of current sources in the variable-current gate driver under control of the PWM signals; and a polyphase power module (PPPM) comprising, for each phase of a motor coupled to the PPPM, one or more hybrid sets of switching transistors of different semiconductor technologies, wherein each of the current sources in the variable-current gate driver is coupled to a gate and at least one of the current sources is coupled to at least one other non-gate terminal of a respective one of the hybrid sets of switching transistors, and wherein the current sources are configured to provide slew rate (SR) control of each respective phase of the PPPM using variable gate current values to compensate for the different semiconductor technologies in real time to reduce switching losses and improve PPPM efficiency.

16. The vehicle of claim 15, wherein each of the current sources coupled to the one or more hybrid sets of transistors in each of the phases of the motor is configured to control the SR for effective capacitor discharge, to limit current or voltage overshoots, to control a temperature, current and voltage of the switching transistors, and to maintain the capacitors of the switching transistors and a battery coupled to the PPPM within a safe operating limit.

17. The vehicle of claim 15, wherein the gate driver is configured to control the SR to enable a multi-voltage level turn-off to reduce a soft turn-off time and to reduce voltage overshoot when the switch is in a short-circuit mode.

18. The vehicle of claim 15, wherein the processing system is further configured to adjust a ratio of usage of non-wide bandgap (WBG) switch(es) over WBG switch(es) based on feedback of the PPPM or motor for reducing temperature and switching losses.

19. The vehicle of claim 15, wherein the one or more hybrid sets of transistors comprises one of at least two semiconductor technologies in the PPPM, wherein the current sources are configured to provide the SR control of the PPPM using variable values of bidirectional gate current; and wherein a turn-on procedure of the one or more hybrid sets of transistors comprises:

a first time period in which at least one power transistor in an off-state has a steady positive value across non-gate terminals thereof, the steady positive value corresponding to an off-state, wherein at or near the end of the first time period, one or more of the current sources are configured to apply a high gate current rated for the at least one power transistor at a high switching speed, reducing deadtime and switching delay;

a second time period during which the one or more of the current sources are configured to reduce a switching speed of the at least one power transistor by applying a lower, non-zero current to the respective gates of the hybrid switch to reduce dV/dt, overshoot, and ringing, while increasing switching speed;

a third time period during which one or more of the current sources are configured to reduce a value of the respective gate currents to reduce dI/dt, overshoot, and ringing; and a fourth time period during which the one or more of the current sources are configured to increase a value of the respective gate currents to a high or near maximum value to minimize an on-resistance across the at least one power transistor and to minimize conduction losses.

20. A variable-current gate driver (VCGD) apparatus for providing slew rate (SR) control of a power inverter module (PIM), comprising:

a gate driver including a plurality of input terminals for receiving pulse-width-modulation (PWM) control signals transmitted from a processing system and a plurality of outputs; and a plurality of current sources under control of the PWM signals and coupled to a corresponding one of the plurality of outputs on the gate driver with the plurality of outputs coupled to respective gates of at least two transistors of a hybrid switch in the PIM, the at least two transistors comprising at least two different semiconductor technologies, at least one of the current sources is respectively coupled to one other non-gate terminal on each of the at least two transistors, wherein the plurality of current sources are configured to provide the SR control of the PIM using variable gate current values to compensate for the different semiconductor technologies in real time to reduce switching losses and improve PM efficiency, wherein the hybrid switch comprises one of at least two semiconductor technologies in the PM, wherein the current sources are configured to provide the SR control of the PM using variable values of bidirectional gate current, wherein a turn-on procedure of the hybrid switch comprises:

a first time period in which at least one power transistor in an off-state has a steady positive value across non-gate terminals thereof, the steady positive value corresponding to an off-state, wherein at or near the end of the first time period, one or more of the current sources are configured to apply a high gate current rated for the at least one power transistor at a high switching speed, reducing deadtime and switching delay;

a second time period during which the one or more of the current sources are configured to reduce a switching speed of the at least one power transistor by applying a lower, non-zero current to the respective gates of the hybrid switch to reduce dV/dt, overshoot, and ringing, while increasing switching speed;

a third time period during which one or more of the current sources are configured to reduce a value of the respective gate currents to reduce dI/dt, overshoot, and ringing; and a fourth time period during which the one or more of the current sources are configured to increase a value of the respective gate currents to a high or near maximum value to minimize an on-resistance across the at least one power transistor and to minimize conduction losses.

\* \* \* \* \*